(12) United States Patent
Miyamoto

(10) Patent No.: US 10,793,967 B2
(45) Date of Patent: Oct. 6, 2020

(54) SUBSTRATE HOLDER AND PLATING APPARATUS USING THE SAME

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 184 days.

(21) Appl. No.: 15/645,530

(22) Filed: Jul. 10, 2017

(65) Prior Publication Data

US 2018/0016698 A1 Jan. 18, 2018

(30) Foreign Application Priority Data

Jul. 13, 2016 (JP) .................................. 2016-138431

(51) Int. Cl.
| | | |
|---|---|---|
| *C25D 17/06* | (2006.01) | |
| *C25D 7/12* | (2006.01) | |
| *C25D 17/00* | (2006.01) | |
| *H01L 21/687* | (2006.01) | |
| *H01L 21/67* | (2006.01) | |

(52) U.S. Cl.
CPC .............. *C25D 17/06* (2013.01); *C25D 7/12* (2013.01); *C25D 17/001* (2013.01); *H01L 21/6723* (2013.01); *H01L 21/68728* (2013.01); *C25D 7/123* (2013.01)

(58) Field of Classification Search
CPC C25D 7/12–123; C25D 17/001; C25D 17/06; H01L 21/67–28792; B25B 11/00–02
See application file for complete search history.

(56) References Cited

U.S. PATENT DOCUMENTS

| | | | | |
|---|---|---|---|---|
| 5,429,733 | A | * | 7/1995 | Ishida ...................... C25D 7/12 |
| | | | | 204/224 R |
| 6,660,139 | B1 | * | 12/2003 | Sendai ................ H01L 21/2885 |
| | | | | 118/428 |
| 2005/0014368 | A1 | | 1/2005 | Yoshioka et al. |
| 2005/0023149 | A1 | * | 2/2005 | Nakada .................. C25D 17/06 |
| | | | | 205/137 |

(Continued)

FOREIGN PATENT DOCUMENTS

| | | | |
|---|---|---|---|
| JP | 4162440 B2 | 10/2008 | |
| JP | 2012-508814 A | 4/2012 | |
| JP | 2013-040404 A | 2/2013 | |

*Primary Examiner* — Alexander W Keeling
(74) *Attorney, Agent, or Firm* — BakerHostetler

(57) ABSTRACT

A substrate holder has a first holding member having a first surface configured to contact with a substrate, and a second holding member for sandwiching and holding the substrate together with the first holding member. The first holding member has a positioning member for positioning the substrate in contact with the first surface at a prescribed position of the first surface. The positioning member is configured to move between a first position where the substrate is to be positioned at the prescribed position of the first surface, in contact with a peripheral edge part of the substrate, and a second position not in contact with the substrate. The second holding member has a driving member configured to cause the positioning member to be positioned at the first position, at the time when holding the substrate by the first holding member and the second holding member.

16 Claims, 18 Drawing Sheets

(56) References Cited

U.S. PATENT DOCUMENTS

| | | | |
|---|---|---|---|
| 2005/0284754 A1* | 12/2005 | Herchen | C25D 7/12 204/297.01 |
| 2011/0034034 A1* | 2/2011 | Du Bois | H01L 21/68 438/758 |
| 2011/0278162 A1 | 11/2011 | Fredenberg et al. | |
| 2013/0042454 A1 | 2/2013 | Feng et al. | |
| 2015/0218726 A1* | 8/2015 | Feng | C25D 17/06 204/297.14 |

* cited by examiner

SUBSTRATE HOLDER AND PLATING APPARATUS USING THE SAME

CROSS REFERENCE TO RELATED APPLICATIONS

This application is based upon and claims benefit of priority from Japanese Patent Application No. 2016-138431 filed on Jul. 13, 2016, the entire contents of which are incorporated herein by reference.

BACKGROUND OF THE INVENTION

Field of the Invention

The present invention relates to a substrate holder and a plating apparatus using this substrate holder.

Description of the Related Art

Forming a projection-shaped connection electrode (bump), composed of gold, copper, solder, nickel, or a metal laminated with multiple layers of these, at a prescribed location on the surface of a semiconductor chip on which wiring is formed, has been extensively performed, for example, in Tape Automated Bonding (TAB) or the manufacture of a flip chip. A package electrode or a TAB electrode is electrically connected to a semiconductor chip, via this bump. There are various techniques, such as an electrolytic plating method, an evaporation method, a printing method, and a ball bump method, as a formation method of this bump. In recent years, an electrolytic plating method, which is capable of being miniaturized and is comparatively stable, has often been used, along with an increase in I/O number, and pitch miniaturization, of semiconductor chips.

An electrolytic plating method is roughly divided into a cup-type and a dip-type. In a cup-type, plating is performed on a substrate, by horizontally placing the surface to be plated on a substrate, such as a semiconductor wafer, facing downwards (face-down), and spouting a plating liquid from below. In a dip-type, plating is performed on a substrate, by vertically standing a substrate within a plating bath, and injecting a plating liquid from below the plating bath to cause overflow. An electrolytic plating method that adopts a dip-type has the advantages of a favorable omission of bubbles that provide an adverse influence on a plated product, and a small footprint. Accordingly, the dimensions of a plating hole will be comparatively large, and can be considered to be suitable for bump plating that requires a long time for plating.

A substrate holder, which freely attachably/detachably holds a substrate such as a semiconductor wafer, has been used in a conventional electrolytic plating apparatus that adopts a dip-type. This substrate holder causes the surface of the substrate (the surface to be plated) to be exposed, by sealing the end surface and the rear surface of the substrate. Plating is performed on the surface of the substrate, by causing this substrate holder to soak within a plating liquid along with the substrate.

The substrate holder has electrical connection points in contact with the substrate surface, in order for electricity to flow to the substrate surface. For example, in a substrate holder configured to freely attachably/detachably hold a substrate by a pair of holding members, electrical connection points are provided on one of the holding members. The electrical connection points contact with the substrate surface, by holding the substrate by these holding members, in a state where placing the substrate on a support surface of the other holding member.

In such a substrate holder, the above described electrical connection points are formed in a plate spring shape, and centering the substrate to the center of the support surface is performed on the support surface by the electrical connection points provided in one of the holding members, at the time when holding the substrate by these holding members (refer to Japanese Patent No. 4162440). Namely, the substrate is biased to a center direction, by causing the electrical connection points to contact with an edge part of the substrate, and using the elastic force of the electrical connection points.

SUMMARY OF THE INVENTION

Since such electrical connection points bias the substrate to a center direction by the elastic force of a plate spring, there will be cases where the elastic force of each electrical connection point is not uniform, and there will be cases where it is difficult to accurately perform centering (positioning) of the substrate. Moreover, there will be the following problem in the centering (positioning) of the substrate by the elastic force of the plate spring. Namely, while the elastic force of the plate spring is determined by the position at the time of no load, the position at the time of a load, and the dimensions, of the movable part of the plate spring, from the viewpoint of the performance of the plate spring, there will be cases where it is difficult to manage these settings, and where it is difficult to accurately and finely adjust the elastic force. It is preferable to have a plate spring with a high rigidity in order to set highly the centering (positioning) performance of the substrate. However, in the case of a plate spring with a high rigidity, the load added to the substrate by the plate spring will be high, and in the worst case, there is the possibility of causing damage to the substrate. Contrary to this, if a plate spring with a low rigidity is used, damage to the substrate can be suppressed. However, a plate spring with a low rigidity will have the problem of a low performance of the centering (positioning) of a substrate. Therefore, there is the problem of appropriately performing centering (positioning) of a substrate, without causing damage to the substrate.

Moreover, in Japanese Patent No. 4162440, in the case where metal fatigue occurs in the electrical connection points due to performing detachment/attachment of a substrate over a multiple number of times by the substrate holder, there is the possibility that centering of the substrate will not be able to be accurately performed. In addition, there are a plurality of electrical connection points provided in the substrate holder of Japanese Patent No. 4162440. These electrical connection points are consumable articles, and there will be cases where only a part of the plurality of electrical connection points are exchanged. In this way, in the case where old electrical connection points and new electrical connection points are attached to the substrate holder, there is the possibility that the elastic force will differ for each electrical connection point, and as a result of this, there is the possibility that centering of the substrate will not be able to be accurately performed.

The present invention is performed by considering the above described problems, and one objective of the present invention is to provide a substrate holder having a new positioning structure, which does not use a plate spring, and a plating apparatus using this substrate holder.

According to one aspect of the present invention, a substrate holder is provided. This substrate holder has a first holding member having a first surface configured to contact with a substrate, and a second holding member for sandwiching and holding the substrate together with the first holding member. The first holding member has a positioning member for positioning the substrate which is in contact with the first surface, at a prescribed position of the first surface. The positioning member is configured to move between a first position where the substrate is to be positioned at the prescribed position of the first surface, in contact with a peripheral edge part of the substrate, and a second position not in contact with the substrate. The second holding member has a driving member configured to cause the positioning member to be positioned at the first position, at the time when holding the substrate by the first holding member and the second holding member.

According to this aspect, the positioning member can move between the first position and the second position, and the driving member can move the positioning member to the first position, at the time when holding the substrate by the first holding member and the second holding member. As a result, the substrate can be positioned, by causing the positioning member to move to the first position by the driving member, without using a plate spring having an elastic force for the positioning member. Namely, the substrate can be accurately positioned at the first position, and the substrate can be held in a so-called fixed position. Moreover, since it is not necessary to use a plate spring for the positioning member, the positioning member can be formed by a rigid body such as a resin or metal. Accordingly, the problem of not being able to sufficiently secure the positioning accuracy of a substrate, arising from the elastic force of a plate spring not being uniform, will be solved. In the case where a substrate is positioned by a conventional plate spring structure, it will be necessary to have a width to the degree of the plate spring structure, in order to secure an elastic force for sufficiently biasing the substrate. However, according to this one aspect, since it is not necessary to use a plate spring for the positioning member, the positioning member can be formed by a rigid body, and as a result of this, the width of the positioning member (the width of the substrate peripheral direction) can be reduced compared to that used conventionally. Consequently, since the width of the positioning member can be reduced, the width of a power feed portion can be increased, and the power feed portion can be arranged over approximately the entire periphery of the substrate. As a result of this, an electrical current can flow uniformly to the substrate, and the in-plane uniformity of a plating film formed on the substrate can be improved.

According to one aspect of the present invention, a substrate holder is provided. This substrate holder has a first holding member having a first surface configured to contact with a substrate, and a second holding member for sandwiching and holding the substrate together with the first holding member. The second holding member has a positioning member for positioning the substrate which is in contact with the first surface, at a prescribed position of the first surface. The positioning member is configured to move between a first position where the substrate is to be positioned at the prescribed position of the first surface, in contact with a peripheral edge part of the substrate, and a second position not in contact with the substrate. The first holding member has a driving member configured to cause the positioning member to be positioned at the first position, at the time when holding the substrate by the first holding member and the second holding member.

According to this aspect, the positioning member can move between the first position and the second position, and the driving member can move the positioning member to the first position, at the time when holding the substrate by the first holding member and the second holding member. As a result, the substrate can be positioned, by causing the positioning member to move to the first position by the driving member, without using a plate spring having an elastic force for the positioning member. Namely, the substrate can be accurately positioned at the first position, and the substrate can be held in a so-called fixed position. Moreover, since it is not necessary to use a plate spring for the positioning member, the positioning member can be formed by a rigid body such as a resin or metal. Accordingly, the problem of not being able to sufficiently secure the positioning accuracy of a substrate, arising from the elastic force of a plate spring not being uniform, will be solved. In the case where a substrate is positioned by a conventional plate spring structure, it will be necessary to have a width to the degree of the plate spring structure, in order to secure an elastic force for sufficiently biasing the substrate. However, according to this one aspect, since it is not necessary to use a plate spring for the positioning member, the positioning member can be formed by a rigid body, and as a result of this, the width of the positioning member (the width of the substrate peripheral direction) can be reduced compared to that used conventionally. Consequently, since the width of the positioning member can be reduced, the width of a power feed portion can be increased, and the power feed portion can be arranged over approximately the entire periphery of the substrate. As a result of this, an electrical current can flow uniformly to the substrate, and the in-plane uniformity of a plating film formed on the substrate can be improved.

In one aspect of the present invention, the positioning member and/or the driving member are formed by rigid bodies.

According to this aspect, the positioning member and/or the driving member are formed by rigid bodies. In the case where a substrate is positioned by a conventional plate spring structure, it will be necessary to have a width to the degree of the plate spring structure, in order to secure an elastic force for sufficiently biasing the substrate. However, in the case where the positioning member is formed by a rigid body, the width of the positioning member (the width of the substrate peripheral direction) can be reduced compared to that used conventionally. Consequently, since the width of the positioning member can be reduced, the width of a power feed portion can be increased, and the power feed portion can be arranged over approximately the entire periphery of the substrate. As a result of this, an electrical current can flow uniformly to the substrate, and the in-plane uniformity of a plating film formed on the substrate can be improved.

In one aspect of the present invention, the positioning member and/or the driving member are formed from aromatic polyether ketone.

According to this aspect, the positioning member and/or the driving member are formed from aromatic polyether ketone. An aromatic polyether ketone includes, for example, PEK (polyetherketone), PEEK (polyetheretherketone), PEKK (polyetherketoneketone), PEEKK (polyetheretherketoneketone), or a compound material of these. An aromatic polyether ketone, in particular, PEEK, is a resin (rigid body) that has excellent workability and rigidity. Therefore, by having the positioning member and/or the driving member formed by aromatic polyether ketone, in particular, PEEK, the positioning member and/or the driving member can be manufactured with comparative ease. Moreover, since an aromatic polyether ketone, in particular, PEEK, has excellent fatigue resistance, abrasion resistance, and chemical resistance, it will be difficult for the positioning member and/or the driving member to be damaged, and to be affected by a plating liquid, even if repeatedly detaching/attaching the substrate by the substrate holder.

In one aspect of the present invention, the driving member is formed from a synthetic resin.

According to this aspect, the driving member is formed from a synthetic resin. The synthetic resin can include, for example, PVC (polyvinyl chloride) or aromatic polyether ketone. An aromatic polyether ketone includes, for example, PEK (polyetherketone), PEEK (polyetheretherketone), PEKK (polyetherketoneketone), PEEKK (polyetheretherketoneketone), or a compound material of these. An aromatic polyether ketone, in particular, PEEK, is a resin (rigid body) that has excellent workability and rigidity. Therefore, by having the driving member formed by an aromatic polyether ketone, in particular, PEEK, the driving member can be manufactured with comparative ease. Moreover, since an aromatic polyether ketone, in particular, PEEK, has excellent fatigue resistance, abrasion resistance, and chemical resistance, it will be difficult for the driving member to be damaged, and to be affected by a plating liquid, even if repeatedly detaching/attaching the substrate by the substrate holder.

In one aspect of the present invention, the substrate holder has an biasing member, arranged between the first holding member or the second holding member and the positioning member, for biasing the positioning member to the second position.

According to this aspect, the positioning member is biased to the second position by the biasing member, while not moving to the first position by the driving member. As a result, since the positioning member is automatically positioned at the second position, at the time when not holding the substrate by the first holding member and the second holding member, the substrate can be easily detached/attached from/to the substrate holder.

In one aspect of the present invention, the substrate holder has a pin for freely rotatably supporting the positioning member, wherein the positioning member moves between the first position and the second position, by rotating centered on the pin.

According to this aspect, since the positioning member is freely rotatably supported by the pin, the moving space and setting space of the positioning member can be reduced, for example, compared to the case where the positioning member moves in a horizontal direction or vertical direction between the first position and the second position. Consequently, enlargement of the size of the substrate holder can be suppressed.

In one aspect of the present invention, the positioning member has a tip part, wherein the tip part diverges into a first tip part and a second tip part, wherein the first tip part is positioned at an inner side in a radial direction of the substrate, in a state where the substrate is held by the first holding member and the second holding member, wherein the second tip part is positioned at an outer side in a radial direction of the substrate, in a state where the substrate is held by the first holding member and the second holding member, wherein the first tip part is configured to contact with the substrate, and wherein the second tip part is configured to contact with the driving member.

According to this aspect, the positioning member has a first tip part and a second tip part, and the first tip part and the second tip part diverge. In other words, a space can be generated between the first tip part and the second tip part. At the time when positioning the substrate, the driving member moves the positioning member to the first position by contacting with the second tip part, and the first tip part of the positioning member moved to the first position in response to this contacts with the substrate. At this time, by having a space exist between the first tip part and the second tip part, the first tip part can contact with the substrate by having some elasticity. In that case, even if there is a substrate with a difference in size of several millimeters, the substrate with a difference in size can be positioned by the positioning member, by having the first tip part adsorb this dimension difference of several millimeters. Note that, the space between the first tip part and the second tip part may be a cavity, or may be filled by an arbitrary elastic body.

In one aspect of the present invention, the first holding member has a guide member for guiding the substrate to the prescribed position on the first surface.

According to this aspect, the substrate can be easily arranged in a prescribed region, at the time when arranging the substrate on a support surface.

In one aspect of the present invention, the first holding member or the second holding member has a substrate seal member for sealing between the second holding member and the substrate, and a holder seal member for sealing between the second holding member and the first holding member.

In one aspect of the present invention, the substrate holder has a power feed portion for feeding electricity to the substrate, wherein the power feed portion is configured to contact with the substrate across a length equal to or more than 95% of a peripheral direction of the substrate.

According to this aspect, since the power feed portion contacts with the substrate over approximately the entire periphery of the substrate, the uniformity of the current flowing to the substrate surface can be improved.

In one aspect of the present invention, a plating apparatus is provided for performing a plating process on a substrate by using the above described substrate holders.

DETAILED DESCRIPTION OF THE PREFERRED EMBODIMENTS

First Embodiment

Figure 1:
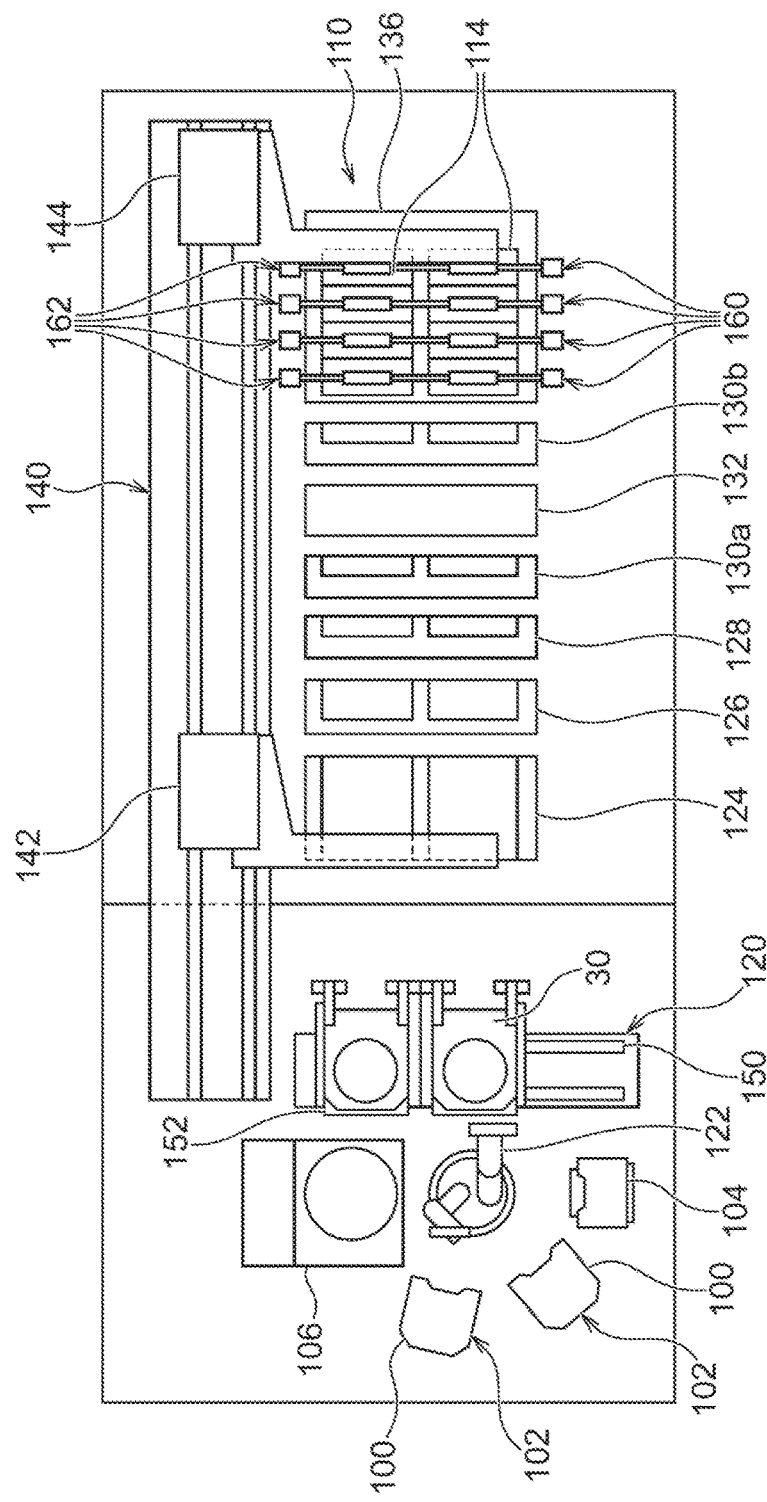
FIG. 1 is a general arrangement view of a plating apparatus for performing a plating process by using a substrate holder according to a first embodiment.

Hereinafter, embodiments of the present invention will be described by referring to the figures. In the figures described hereinafter, the same reference numerals will be attached to the same or corresponding constituent elements, and overlapping descriptions will be omitted. FIG. 1 is a general arrangement view of a plating apparatus for performing a plating process by using a substrate holder according to a first embodiment. As shown in FIG. 1, this plating apparatus has two cassette tables 102, an aligner 104 for aligning the position of an orientation flat, notch or the like of a substrate with a prescribed direction, and a spin rinse dryer 106 for drying a substrate after a plating process by high-speed rotation. The cassette table 102 is mounted with a cassette 100, on which a substrate such as a semiconductor wafer is stored. A substrate attachment/detachment section 120, which performs attachment/detachment of a substrate by placing a substrate holder 30, is provided near the spin rinse dryer 106. A substrate transportation apparatus 122, composed of a transportation robot for transporting a substrate between these units, is arranged in the center of these units 100, 104, 106, and 120.

The substrate attachment/detachment section 120 includes a flat plate-shaped placement plate 152 that freely slides in a horizontal direction along a rail 150. Two of the substrate holders 30 are placed in parallel in a horizontal state on this placement plate 152, and after delivery of a substrate between one of the substrate holders 30 and the substrate transportation apparatus 122 has been performed, the placement plate 152 slides in a horizontal direction, and delivery of a substrate between the other substrate holder 30 and the substrate transportation apparatus 122 is performed.

The plating apparatus additionally has a stocker 124, a pre-wet bath 126, a pre-soak bath 128, a first washing bath 130a, a blow bath 132, a second washing bath 130b, and a plating bath 110. In the stocker 124, storage and temporary placement of the substrate holder 30 is performed. In the pre-wet bath 126, the substrate is soaked in purified water. In the pre-soak bath 128, an oxide film of the surface of an electrically conducting layer, such as a seed layer formed on the surface of the substrate, is etched and removed. In the first washing bath 130a, the substrate after pre-soaking is washed by a washing liquid (such as purified water) together with the substrate holder 30. In the blow bath 132, liquid draining of the substrate after cleaning is performed. In the second washing bath 130b, the substrate after plating is washed by a washing liquid together with the substrate holder 30. The substrate attachment/detachment section 120, the stocker 124, the pre-wet bath 126, the pre-soak bath 128, the first washing bath 130a, the blow bath 132, the second washing bath 130b, and the plating bath 110 are arranged in this order.

This plating bath 110 is configured, for example, by storing a plurality of plating cells 114 inside an overflow bath 136. Each plating cell 114 is configured to store one substrate inside, and apply plating such as copper plating to the substrate surface by soaking the substrate within a plating liquid held inside.

The plating apparatus has a substrate holder transportation apparatus 140 adopting a linear motor system, for example, which transports the substrate holder 30 together with the substrate between each of these devices, by positioning to the side of each of these devices. This substrate holder transportation apparatus 140 has a first transporter 142, and a second transporter 144. The first transporter 142 is configured to transport the substrate between the substrate attachment/detachment section 120, the stocker 124, the pre-wet bath 126, the pre-soak bath 128, the first washing bath 130a, and the blow bath 132. The second transporter 144 is configured to transport the substrate between the first washing bath 130a, the second washing bath 130b, the blow bath 132, and the plating bath 110. The plating apparatus may not include the second transporter 144, and may include only the first transporter 142.

Paddle driving sections 160 and paddle following sections 162, which are positioned inside each of the plating cells 114 and drive paddles as mixing sticks for stirring the plating liquid within the plating cell 114, are arranged on both sides of the overflow bath 136.

An example of a series of plating processes by this plating apparatus will be described. First, one substrate is extracted by the substrate transportation apparatus 122, from the cassette 100 mounted in the cassette table 102, and the substrate is transported to the aligner 104. The aligner 104 aligns the position of an orientation flat, notch or the like with a prescribed direction. The substrate aligned in the direction by this aligner 104 is transported up to the substrate attachment/detachment section 120, by the substrate transportation apparatus 122.

In the substrate attachment/detachment section 120, two of the substrate holders 30 stored within the stocker 124 are gripped at the same time by the first transporter 142 of the substrate holder transportation apparatus 140, and are transported up to the substrate attachment/detachment section 120. Then, the two substrate holders 30 are placed horizontally at the same time on the placement plate 152 of the substrate attachment/detachment section 120. In this state, the substrate transportation apparatus 122 transports substrates to the respective substrate holders 30, and the transported substrates are held by the substrate holders 30.

Next, the two substrate holders 30 holding the substrates are gripped at the same time by the first transporter 142 of the substrate holder transportation apparatus 140, and are stored in the pre-wet bath 126. Next, the substrate holders 30 holding the substrates processed by the pre-wet bath 126 are transported to the pre-soak bath 128 by the first transporter 142, and an oxide film is etched on the substrates by the pre-soak bath 128. To continue, the substrate holders 30 holding these substrates are transported to the first washing bath 130a, and the surfaces of the substrates are washed by purified water stored in this first washing bath 130a.

The substrate holders 30 holding the substrates for which washing is completed are transported from the first washing bath 130a to the plating bath 110, by the second transporter 144, and are stored in the plating cell 114 filled with a plating liquid. The second transporter 144 sequentially stores the substrate holders 30 holding the substrates in each of the plating cells 114 of the plating bath 110, by sequentially repeating the above described procedure.

In each of the plating cells 114, plating is performed on the surface of the substrate, by applying a plating voltage between an anode (not illustrated) within the plating cell 114 and the substrate, and causing the paddles to move back-and-forth in parallel with the surface of the substrate by the paddle driving section 160 and the paddle following section 162 at the same time.

After the plating is finished, the two substrate holders 30 holding the substrates after plating are gripped at the same time by the second transporter 144, transported up to the second washing bath 130b, and the surfaces of the substrates are washed with purified water by soaking in purified water stored in the second washing bath 130b. Next, the substrate holders 30 are transported to the blow bath 132 by the second transporter 144, and water drops adhered to the substrate holders 30 are removed by the spraying of air or the like. Afterwards, the substrate holders 30 are transported to the substrate attachment/detachment section 120 by the first transporter 142.

In the substrate attachment/detachment section 120, the substrate after processing is extracted from the substrate holder 30 by the substrate transportation apparatus 122, and is transported to the spin rinse dryer 106. The spin rinse dryer 106 causes the substrate after the plating process to rotate at high speed and dry by high-speed rotation. The dried substrate is returned to the cassette 100 by the substrate transportation apparatus 122.

Figure 2:
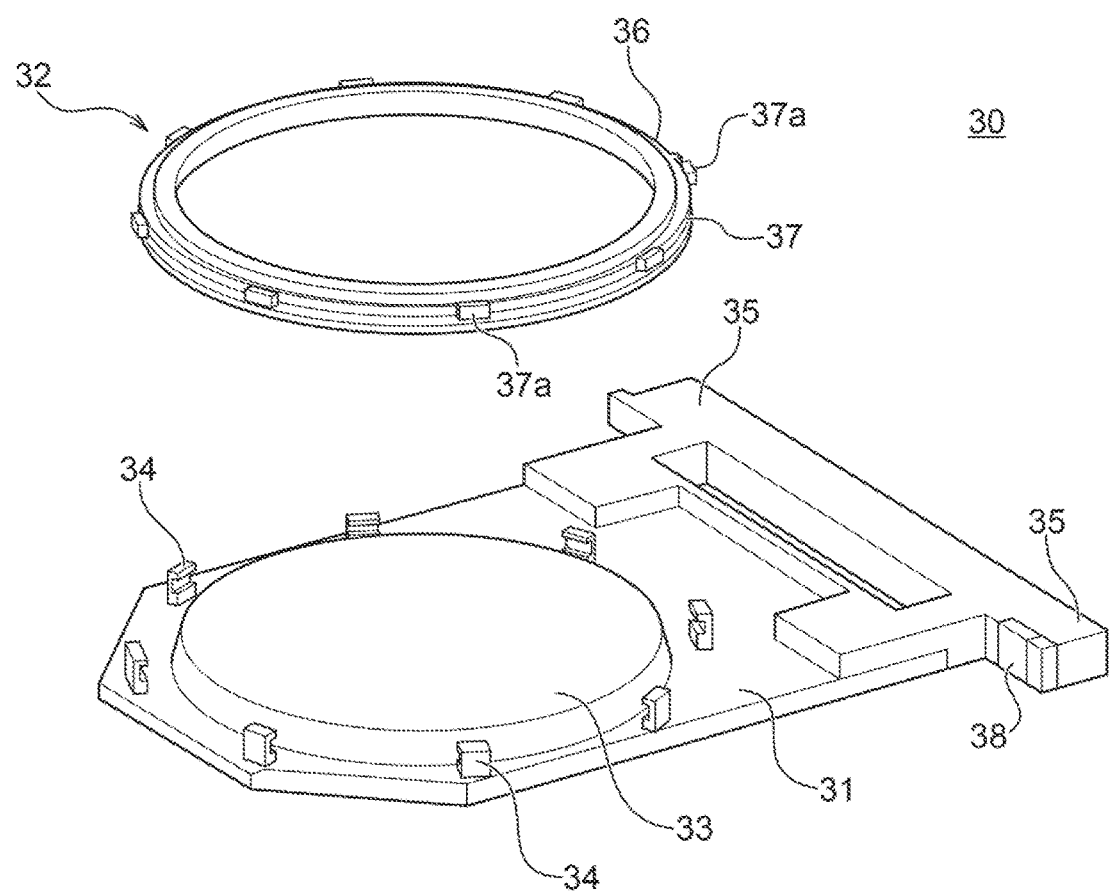
FIG. 2 is an exploded perspective view of the substrate holder according to a first embodiment.

Next, the details of the substrate holder 30 shown in FIG. 1 will be described. FIG. 2 is an exploded perspective view of the substrate holder 30 according to the first embodiment. As shown in FIG. 2, the substrate holder 30 has a rectangular flat plate-shaped first holding member 31 made, for example, by vinyl chloride, and a second holding member 32 configured to freely attach/detach with respect to this first holding member 31. This substrate holder 30 holds a substrate such as a wafer by sandwiching the substrate by the first holding member 31 and the second holding member 32. A support surface 33 (corresponding to an example of a first surface) for supporting the substrate is provided in an approximately center part of the first holding member 31 of the substrate holder 30. Moreover, a plurality of inverse L-shaped clampers 34, which have projection parts that project inwardly, are provided at equal intervals along the circumference of the support surface 33, on the outer side of the support surface 33 of the first holding member 31.

A pair of hands 35, which become supporting parts when transporting or suspension-supporting the substrate holder 30, are connected to the end part of the first holding member 31 of the substrate holder 30. The substrate holder 30 is vertically suspension-supported, by hanging the hands 35 on the circumference wall upper surface of the stocker 124, within the stocker 124 shown in FIG. 1. Moreover, the substrate holder 30 is transported by gripping the hands 35 of this suspension-supported substrate holder 30 by the first transporter 142 or the second transporter 144.

Moreover, an external connection point part 38 electrically connected to an external power supply is provided in one of the hands 35. This external connection point part 38 is electrically connected to a plurality of relay connection points 60 (refer to FIG. 3, FIG. 4 or the like) provided on the outer periphery of the support surface 33 via a plurality of conducting wires.

The second holding member 32 includes a ring-shaped seal holder 36. A pressor ring 37 for pressing and fixing the seal holder 36 to the first holding member 31 is freely rotatably mounted on the seal holder 36 of the second holding member 32. The pressor ring 37 has a plurality of protruding parts 37a that project outwards on this outer peripheral part. The upper surfaces of the protruding parts 37a and the lower surfaces of the inner projection parts of the clamper 34 have tapered surfaces inclined in mutually opposite directions along a rotational direction.

At the time when holding a substrate, first, the substrate is placed on the support surface 33 of the first holding member 31 in a state where the second holding member 32 is detached from the first holding member 31, and the second holding member 32 is attached to the first holding member 31. To continue, the protruding parts 37a of the pressor ring 37 are slid to the inside (the lower side) of the inner projection parts of the clamper 34, by rotating the pressor ring 37 clockwise. As a result, the first holding member 31 and the second holding member 32 are mutually tightened and locked, and the substrate is held, via the tapered surfaces respectively provided on the pressor ring 37 and the clamper 34. At the time when releasing the holding of the substrate, the pressor ring 37 is rotated anti-clockwise, in a state where the first holding member 31 and the second holding member 32 are locked. As a result, the holding of the substrate is released, by having the protruding parts 37a of the pressor ring 37 removed from the inverse L-shaped clamper 34.

Figure 3:
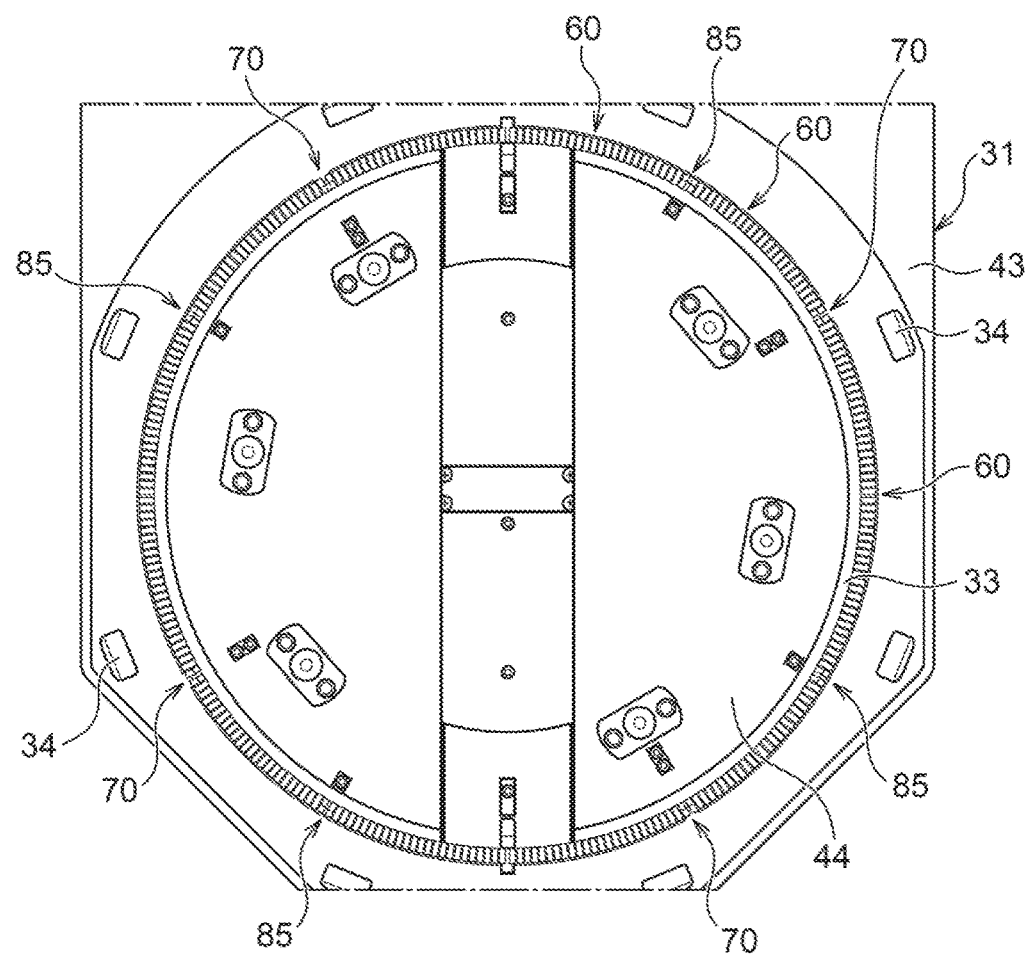
FIG. 3 is a partial plan view of a first holding member of the substrate holder.

FIG. 3 is a partial plan view of the first holding member 31 of the substrate holder 30. As illustrated, the first holding member 31 of the substrate holder 30 has a support base 43, and an approximately disk-shaped movable base 44 separated from the support base 43. A support surface 33 is provided on the movable base 44. Moreover, the first holding member 31 has relay connection points 60 arranged on the support base 43 across the entire periphery of the support surface 33, such as along the circumference of the support surface 33. As described above, the relay connection points 60 are electrically connected to the external connection point part 38 shown in FIG. 2. Moreover, the first holding member 31 has a plurality of positioning members 70 for positioning the substrate arranged on the support surface 33. In the illustrated example, four positioning members 70 are provided in the vicinity of the outer peripheral part of the movable base 44. In addition, the first holding member 31 has a plurality of guide members 85 for guiding the substrate to a prescribed position on the support surface 33.

Figure 4:
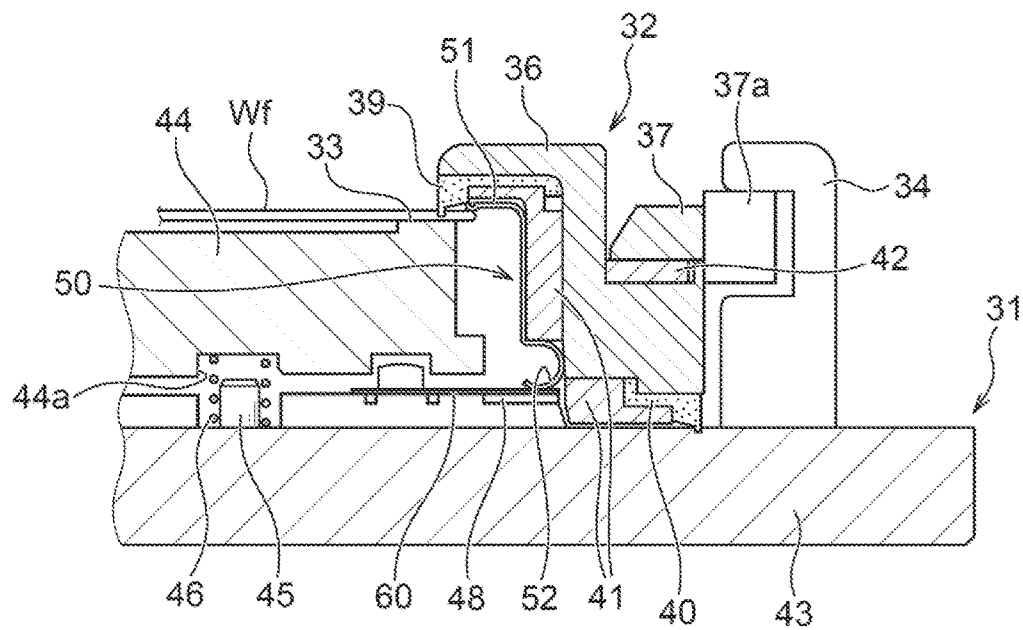
FIG. 4 is a partially expanded sectional view in a cross-section of a thickness direction of the substrate holder in a state where a substrate is held.

FIG. 4 is a partially expanded sectional view in a cross-section of a thickness direction of the substrate holder 30 in a state where a substrate is held. As illustrated, a substrate seal member 39 and a holder seal member 40 are provided on surfaces facing the first holding member 31 of the seal holder 36 of the second holding member 32. The substrate seal member 39 is configured to seal between a substrate Wf surface and the seal holder 36 by contacting with an outer peripheral part of the substrate Wf, at the time when holding the substrate Wf by the substrate holder 30. The substrate seal member 39 may be freely detachably/attachably provided with the second holding member 32 such as in the present embodiment. Moreover, a projection part (or, a component part composed of an elastic body), which has a function for sealing a peripheral edge part of the substrate Wf by contacting with the substrate Wf, may be configured to be integrally inseparable with the second holding member 32, as the substrate seal member 39. The holder seal member 40 is provided more on a outer side in a radial direction than the substrate seal member 39, and is configured to contact with the support base 43 of the first holding member 31. As a result of this, the holder seal member 40 can seal between the seal holder 36 and the support base 43. The substrate seal member 39 and the holder seal member 40 are attached to the seal holder 36 by sandwiching between the seal holder 36, and a fixing ring 41 attached via a fastener such as a bolt to the seal holder 36. Note that, while the substrate seal member 39 and the holder seal member 40 are provided in the second holding member 32 in the illustrated embodiment, instead of this, these seal members may be provided in the first holding member 31.

A step part is provided on the outer peripheral part of the seal holder 36 of the second holding member 32, and the pressor ring 37 is freely rotatably mounted via a spacer 42, on this step part. The pressor ring 37 is configured from a metal having sufficient rigidity (for example, titanium), with excellent corrosion resistance with respect to acid. The spacer 42 is configured by a material with low frictional properties, for example, PTFE (polytetrafluoroethylene), so that the pressor ring 37 can rotate smoothly.

As shown in FIG. 3, the first holding member 31 has a support base 43, and a movable base 44. The support base 43 is an approximately flat plate shape, and contacts with the holder seal member 40 at the time when holding the substrate Wf by the substrate holder 30. The support surface 33 provided on the movable base 44 supports the outer peripheral part of the substrate Wf, at the time when holding the substrate Wf by the substrate holder 30. The support base 43 has projections 45 and cylindrical-shaped compression springs 46, on a surface opposite the movable base 44. While one projection 45 and one compression spring 46 are shown in FIG. 4, a plurality of the projections 45 and compression springs 46 are arranged along the peripheral direction of the support surface 33. The compression springs 46 are arranged to enclose the circumference of the projection 45, and bias the movable base 44 to a direction separated from the support base 43. Concave parts 44a, in which a part of the compression springs 46 are inserted, are provided on a surface opposite the support base 43 of the movable base 44.

The movable base 44 is freely movably attached to the support base 43 in a direction approaching the support base 43, by opposing the biasing force of the compression springs 46. As a result, at the time when holding the substrate Wf with a difference in thickness by the substrate holder 30, the movable base 44 moves in a direction approaching the support base 43 by opposing the biasing force (spring force) of the compression springs 46, in accordance with the thickness of the substrate Wf. Therefore, even in the case where the substrate holder 30 holds the substrate Wf with a difference in thickness, the substrate seal member 39 and the holder seal member 40 can appropriately contact with the substrate Wf and the support base 43, respectively.

Specifically, at the time when holding the substrate Wf by the substrate holder 30 by locking the second holding member 32 to the first holding member 31, the substrate seal member 39 contacts with a position along the outer peripheral part of the substrate Wf held by the substrate holder 30, and the holder seal member 40 contacts with the surface of the support base 43 of the first holding member 31. At this time, the movable base 44 moves with respect to the support base 43, in accordance with the thickness of the substrate Wf. Namely, the movement amount with respect to the support base 43 of the movable base 44 will increase as the thickness of the substrate Wf increases.

Therefore, in this substrate holder 30, the distortion (shrinkage) amount of the compression springs 46 will increase only by an amount approximately corresponding to the increment of thickness of the substrate Wf, as the thickness of the substrate Wf increases, and the movement with respect to the support base 43 of the movable base 44 will increase, by this amount. In this way, since the movement amount of the movable base 44 changes in accordance with the thickness of the substrate Wf, the substrate Wf with a difference in thickness can be held by the substrate holder 30, in a state where the compression dimensions of the substrate seal member 39 are kept within a constant range.

Figure 5:
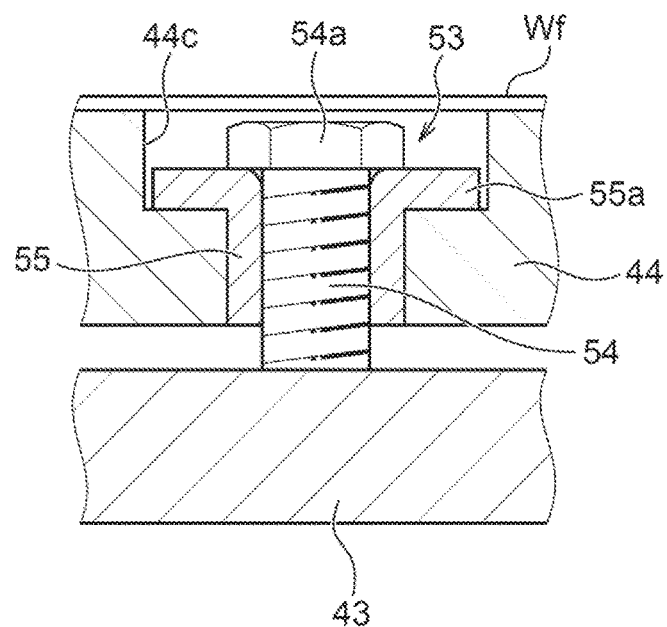
FIG. 5 is an expanded sectional view showing a base guide mechanism.

FIG. 5 is an expanded sectional view showing a base guide mechanism. The substrate holder 30 has a base guide mechanism 53, so that the movable base 44 can be moved smoothly with respect to the support base 43. The base guide mechanism 53 has a guide shaft 54 configured from a bolt or the like fixed to the support base 43, and an approximately cylindrical-shaped shaft receiver 55, fixed to the movable base 44, which has a flange 55a. The guide shaft 54 passes through the inside of the shaft receiver 55. As a result, the movable base 44 is configured to be capable of moving with respect to the support base 43 along an outer peripheral surface of the guide shaft 54. The guide shaft 54 is made of, for example, stainless steel, and the shaft receiver 55 is made of, for example, a resin with good lubricity. In order for the movable base 44 to not move in a horizontal direction with respect to the support base 43, the difference between an outer diameter of the guide shaft 54 and an inner diameter of the shaft receiver 55 can be set to between 0.05 mm and 0.16 mm.

In the illustrated example, the head part of the bolt constituting the guide shaft 54 is used as a stopper 54a, and the flange 55a of the shaft receiver 55 is caused to abut against the stopper 54a, by the spring force of the compression springs 46 (refer to FIG. 4). As a result, the movable base 44 is prevented from detaching from the support base 43. Moreover, in the illustrated example, a concave part 44c is provided on the surface of the movable base 44, and the stopper 54a of the guide shaft 54 is exposed within this concave part 44c. As a result, attachment to and detachment from the support base 43 of the movable base 44 can be easily performed, via the bolt constituting the guide shaft 54.

The description will return to FIG. 4. As shown in FIG. 4, flat plate-shaped relay connection points 60 are provided on the support base 43 of the first holding member 31. While one relay connection point 60 is shown in FIG. 4, a plurality of the relay connection points 60 are arranged on the support base 43, along the circumference of the support surface 33, such as shown in FIG. 3. The relay connection points 60 are electrically connected by conducting wires, which are not illustrated, to the external connection point part 38 shown in FIG. 2. The relay connection points 60 are fixed to the support base 43 by arbitrary fixing devices such as screws at one end side. Moreover, a step part 48 is formed on the support base 43, so that the other end sides of the relay connection points 60 become free ends.

A plurality of power feed connection points 50 (corresponding to an example of a power feed portion), which feed electricity to the substrate Wf by contacting with the outer peripheral part of the substrate Wf supported by the support surface 33, at the time when holding the substrate Wf by the substrate holder 30, are attached to the inner peripheral surface of the fixing ring 41 of the second holding member 32. While one power feed connection point 50 is shown in FIG. 4, a plurality of the power feed connection points 50 are attached across approximately the entire periphery of the fixing ring 41. Note that, the power feed connection points 50 may be attached to the second holding member 32 as a member different to the second holding member 32, or may be integrally formed with the second holding member 32.

The power feed connection points 50 have a plurality of first end parts 51 in contact with the substrate Wf, and a plurality of second end parts 52 in contact with the relay connection points 60. The power feed connection points 50 are preferably formed from a spring material such as stainless steel. The first end parts 51 are configured by projecting in a plate spring shape to the front side (the center side of the support surface 33), bent at an angle of approximately 90 degrees. The first end parts 51 are configured to elastically contact with the outer peripheral part of the substrate Wf, at the time when holding the substrate Wf by the substrate holder 30, such as shown in FIG. 4. Specifically, the first end parts 51 can contact with the outer peripheral part of the substrate Wf while deflecting, at the time when holding the substrate Wf by the substrate holder 30. As a result, the first end parts 51 of the power feed connection points 50 can add a force arising from the elasticity of the first end parts 51 to the outer peripheral part of the substrate Wf, and can surely contact with the substrate Wf. Moreover, the first end parts 51 contact with the substrate Wf across 95% or more of a peripheral direction of the substrate Wf.

As shown in FIG. 4, the second end parts 52 of the power feed connection points 50 have an approximately C-shaped section in a cross-section of a thickness direction of the substrate holder 30. Specifically, the second end parts 52 form an approximately C-shaped section, by curving to the opposite side to the bending direction (front side) of the first end parts 51. As a result, the second end parts 52 of the power feed connection points 50 are configured to elastically contact with the relay connection points 60 at the time when holding the substrate Wf by the first holding member 31 and the second holding member 32. More specifically, the second end parts 52 of the power feed connection points 50 elastically contact with the relay connection points 60, so as to bias the relay connection points 60 towards the first holding member 31, at the time when holding the substrate Wf by the first holding member 31 and the second holding member 32. As a result, the second end parts 52 of the power feed connection points 50 can add a force arising from the elasticity of the second end parts 52 to the relay connection points 60, and can surely contact with the relay connection points 60. In addition to this, since the power feed connection points 50 are configured to elastically contact with the relay connection points 60, the relay connection points 60 can be formed in a flat plate shape, such as in the first embodiment. Therefore, it is not necessary for the relay connection points 60 to be formed by a spring material such as stainless steel, and the cost of the substrate holder 30 can be reduced.

Note that, while the second end parts 52 are formed so as to have an approximately C-shaped section such as shown in FIG. 4, the shape of the second end parts 52 will not be limited to this, if the second end parts 52 can elastically contact with the relay connection points 60 at the time when holding the substrate Wf by the first holding member 31 and the second holding member 32. For example, the second end parts 52 may be formed in a blade spring shape, a coil spring shape, or a plate spring shape, so that the second end parts 52 deflect at the time when contacting with the relay connection points 60.

As shown in FIG. 4, the portions in contact with the relay connection points 60 of the second end parts 52 are formed in a curved shape. In this way, it is preferable for the second end parts 52 to contact at a curved surface with the relay connection points 60 at the time when holding the substrate Wf by the first holding member 31 and the second holding member 32. At the time when the second end parts 52 of the power feed connection points 50 elastically contact with the relay connection points 60, there is the possibility that the contact part between the second end parts 52 and the relay connection points 60 will shift, due to a reactive force from the relay connection points 60 against the elastic force. If the second end parts 52 of the power feed connection points 50 contact at a curved surface with the relay connection points 60, such as in the first embodiment, the friction between the second end parts 52 and the relay connection points 60 can be eased, even in the case where the contact part between the second end parts 52 and the relay connection points 60 is shifted. Consequently, in the case where a metal plating or the like for improving conductivity is covered on the surface of the relay connection points 60, peeling of the metal plating or the like of the surface of the relay connection points 60 can be suppressed.

Moreover, as shown in FIG. 4, the second end parts 52 of the power feed connection points 50 have an upper side and a rear side that are surrounded by the fixing ring 41 and the seal holder 36. In other words, the fixing ring 41 and the seal holder 36 of the second holding member 32 constitute a wall surface part surrounding at least a part of a region other than the contact part with the relay connection points 60 of the second end parts 52. As described above, at the time when the second end parts 52 of the power feed connection points 50 elastically contact with the relay connection points 60, there is the possibility that the second end parts 52 will shift with respect to the relay connection points 60, due to a reactive force from the relay connection points 60 against the elastic force. According to the first embodiment, at the time when the second end parts 52 shift with respect to the relay connection points 60, the second end parts 52 will contact with the above described wall surface part. Therefore, the displacement amount of the shift with respect to the relay connection points 60 of the second end parts 52, at the time when the second end parts 52 elastically contact with the relay connection points 60, can be suppressed within an interval of the gap between the wall surface part and the second end parts 52. In other words, shifting of the second end parts 52 with respect to the first end parts 51 can be suppressed.

Figure 6:
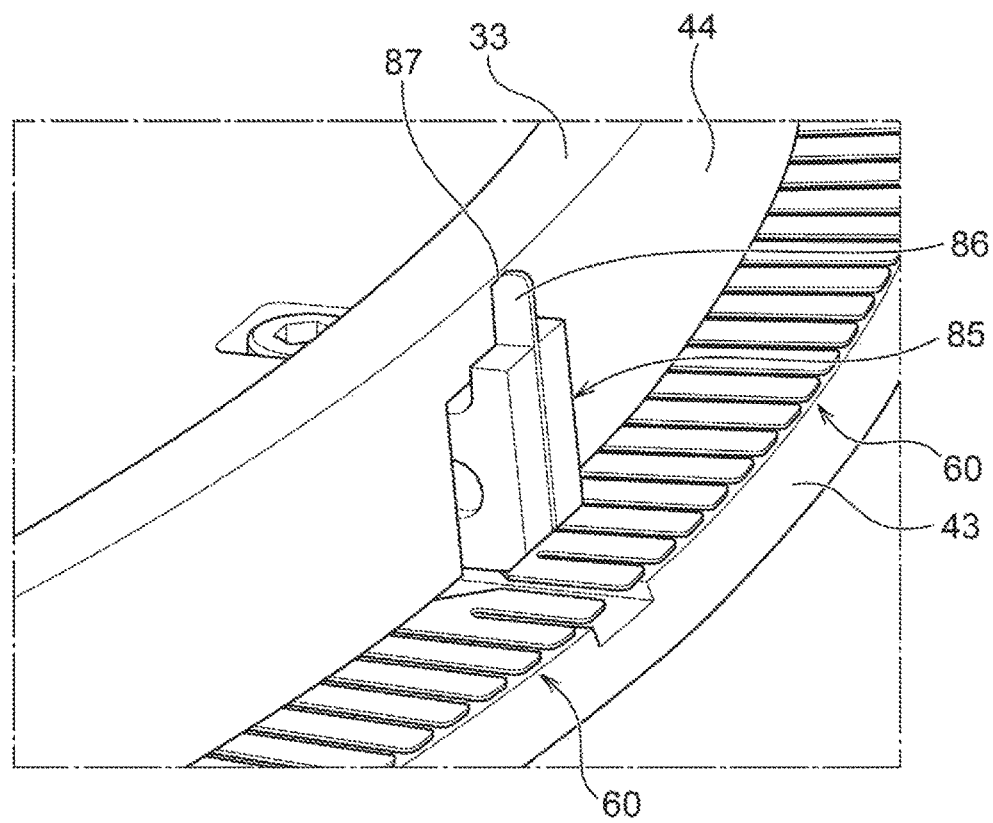
FIG. 6 is a schematic perspective view of a guide member shown in FIG. 3.

FIG. 6 is a schematic perspective view of the guide member 85 shown in FIG. 3. The guide member 85 is provided on the movable base 44 of the first holding member 31. Moreover, the guide member 85 has a plate-shaped part 86 positioned on the outer side of the support surface 33. The tip of the plate-shaped part 86 is positioned slightly higher than the support surface 33, and has a tapered surface 87 on the support surface 33 side. The substrate Wf arranged on the support surface 33 is guided to a prescribed position of the support surface 33, by the tapered surface 87 of the plate-shaped part 86.

Figure 7:
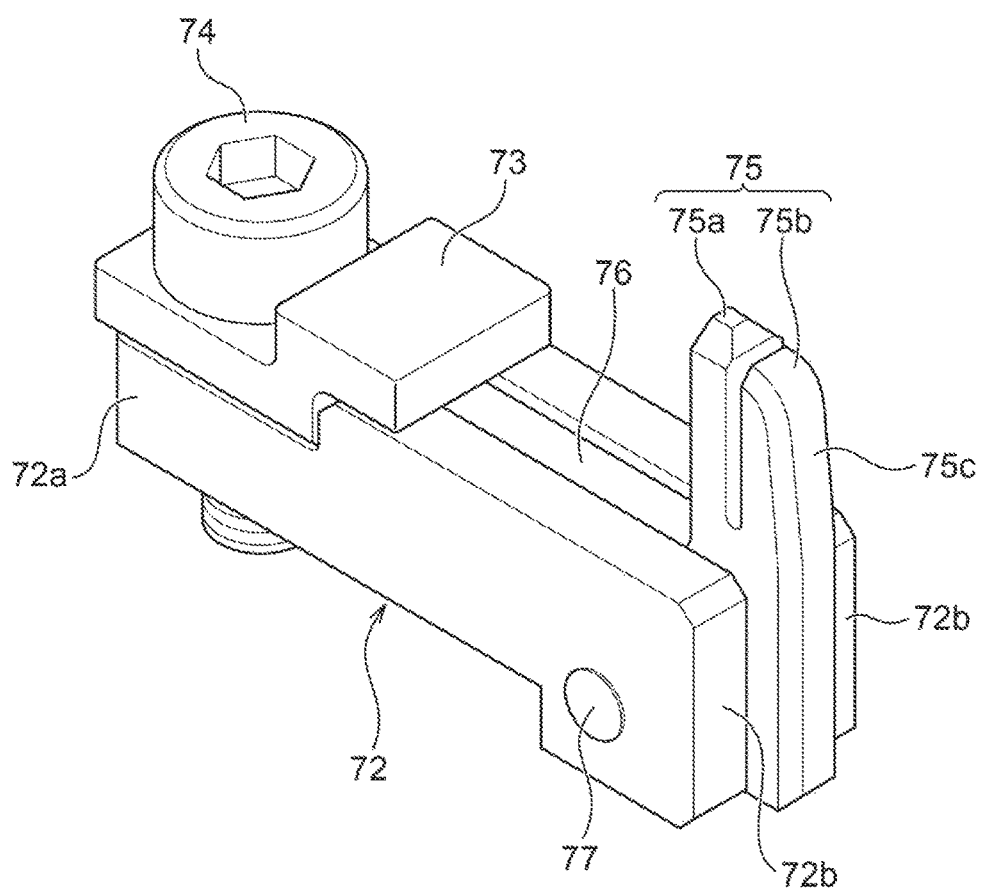
FIG. 7 is a perspective view of a positioning member shown in FIG. 3.
Figure 8:
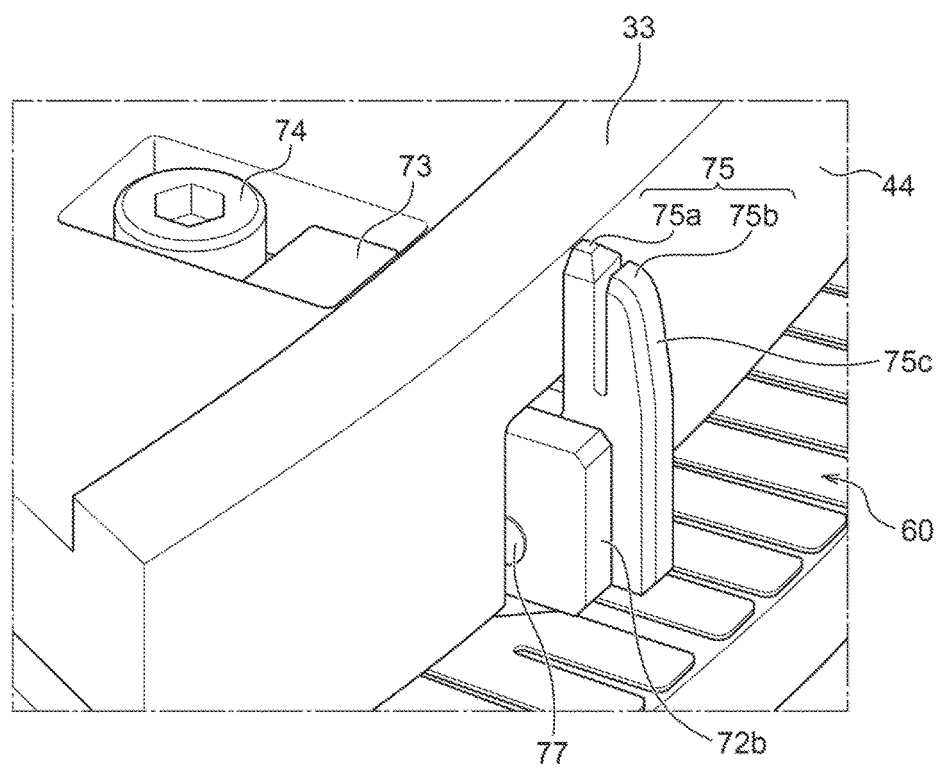
FIG. 8 is a perspective view of the positioning member in a state where attached to a movable base.
Figure 9:
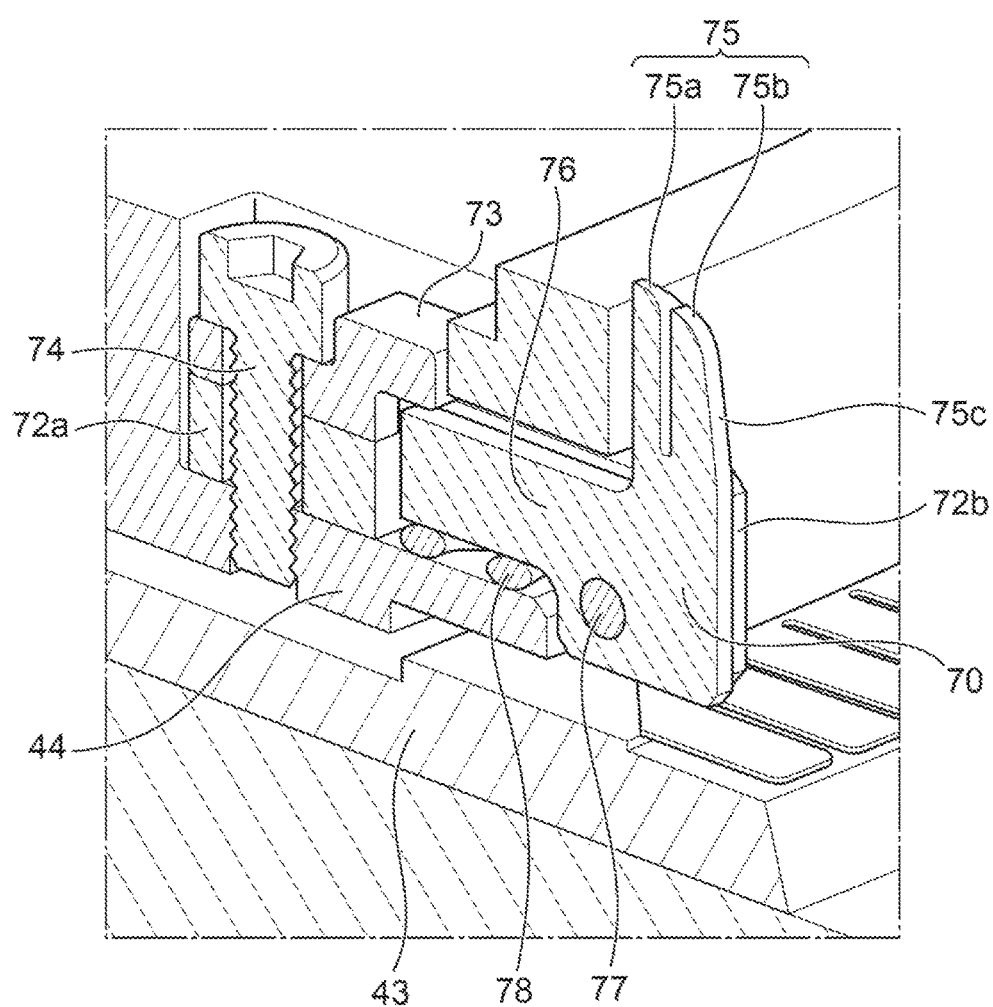
FIG. 9 is a perspective view showing a vertical section of the positioning member.

FIG. 7 is a perspective view of the positioning member 70 shown in FIG. 3. FIG. 8 is a perspective view of the positioning member 70 in a state where attached to the movable base 44. FIG. 9 is a perspective view showing a vertical section of the positioning member 70. As shown in FIG. 7 to FIG. 9, the positioning member 70 is a member with a section that is approximately L-shaped, and has an arm part 76 extending approximately parallel to the support surface 33, and a tip part 75 extending to above the support surface 33 so as to be approximately orthogonal from the arm part 76. The tip part 75 diverges into a first tip part 75a and a second tip part 75b. In other words, a space exists between the first tip part 75a and the second tip part 75b. This space may be a cavity such as shown in FIG. 7 to FIG. 9, or may be filled by an arbitrary elastic body.

The first tip part 75a is positioned at an inner side in a radial direction of the substrate Wf, in a state where the substrate Wf is held by the first holding member 31 and the second holding member 32. In other words, the first tip part 75a is positioned at an inner side in a radial direction of the support surface 33. The second tip part 75b is positioned more at an outer side in a radial direction of the substrate Wf than the first tip part 75a, in a state where the substrate Wf is held by the first holding member 31 and the second holding member 32. In other words, the second tip part 75b is positioned more at an outer side in a radial direction of the support surface 33 than the first tip part 75a. A tapered surface 75c is formed, so that the second tip part 75b has a width that decreases towards the tip side, on the outer side of the second tip part 75b in the radial direction. As will be described below, the first tip part 75a has a surface in contact with the substrate Wf, and the second tip part 75b has a surface in contact with the fixing ring 41.

The positioning member 70 can be formed from an arbitrary material. However, from the viewpoint of improving the accuracy of the positioning of the substrate Wf, it is preferable for the positioning member 70 to be formed by a rigid body. Moreover, from the viewpoint of workability, fatigue resistibility, abrasion resistance, and chemical resistibility of the positioning member 70, it is preferable for the positioning member 70 to be formed from an aromatic polyether ketone, such as PEK, PEEK, PEKK, PEEKK, or a compound material of these. An aromatic polyether ketone, in particular, PEEK, is a resin (rigid body) that has excellent workability and rigidity. Therefore, by having the positioning member 70 formed by an aromatic polyether ketone, in particular, PEEK, the positioning member 70 can be processed with comparative ease. Moreover, since an aromatic polyether ketone, in particular, PEEK, has excellent fatigue resistance, abrasion resistance, and chemical resistance, it will be difficult for the positioning member 70 to be damaged, and to be affected by a plating liquid, even if repeatedly detaching/attaching the substrate Wf by the substrate holder 30.

The substrate holder 30 has support members 72 for supporting the positioning member 70. The support members 72 have a connecting part 72a, and a diverging part 72b that diverges from the connecting part 72a towards an end part. The connecting parts 72a are fixed to the movable base 44, by fixing devices 74 such as bolts. The diverging parts 72b are configured to sandwich the positioning member 70.

The positioning member 70 is freely rotatably supported by a pin 77 penetrating through the diverging parts 72b. As a result, the positioning member 70 is freely rotatably supported by the diverging parts 72b of the support members 72.

Moreover, the substrate holder 30 has a stopper 73 for limiting the rotational range of the positioning member 70, by contacting with the arm part 76 of the positioning member 70. The stopper 73 is fixed to the support members 72 by the fixing devices 74. As shown in FIG. 9, an O-ring 78 (corresponding to an example of an biasing member), which biases the arm part 76 to the support surface 33 side, is provided between the arm part 76 of the positioning member 70 and the movable base 44.

The positioning member 70 shown in FIG. 7 to FIG. 9 is configured to be capable of moving between a first position where the substrate Wf is to be positioned at a prescribed position of the support surface 33 by contacting with a peripheral edge part of the substrate Wf, and a second position not in contact with the substrate Wf, positioned more on an outer side than the peripheral edge part of the substrate Wf. Specifically, the positioning member 70 moves in the direction where the tip part 75 separates from the center side of the support surface 33, rotating centered on the pin 77, by having the arm part 76 biased towards the support surface 33 by the O-ring 78. As a result, the positioning member 70 moves to the second position at which the tip part 75 is not in contact with the substrate, in a state where the substrate Wf is arranged on the support surface 33. Note that, the peripheral edge part of the substrate Wf is called a bevel part of the substrate Wf. In other words, the peripheral edge part of the substrate Wf is called a region with a constant range, which includes the outermost peripheral end of the substrate Wf, and is inclined with respect to a surface to be processed of the substrate Wf at which a rounding process or the like is performed.

Figure 10:
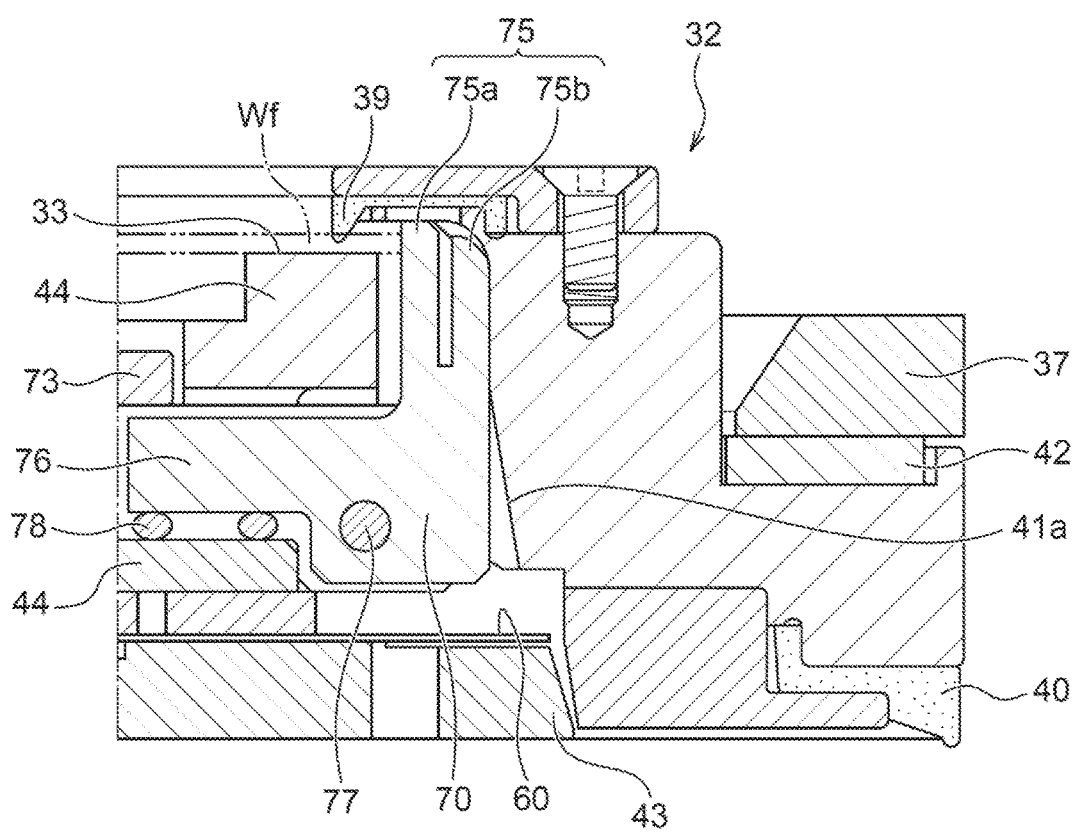
FIG. 10 is a partially expanded sectional view in a cross-section of a thickness direction of the substrate holder in a state where a substrate is held, which shows a state where the positioning member is at a first position.

FIG. 10 is a partially expanded sectional view in a cross-section of a thickness direction of the substrate holder 30 in a state where the substrate Wf is held, which shows a state where the positioning member 70 is at the first position. As shown in FIG. 10, the fixing ring 41 has a tapered surface 41a on an inner peripheral surface. When holding the substrate Wf by the first holding member 31 and the second holding member 32 at the time when the positioning member 70 is at the second position, namely, at a position not in contact with the substrate Wf, the tapered surface 41a of the fixing ring 41 presses the second tip part 75b to the inner side (center part side) of the support surface 33 in the radial direction, by contacting with a tapered surface 75c of the second tip part 75b. As a result, the first tip part 75a can move to the inner side (center part side) of the support surface 33 in the radial direction, and can position the substrate Wf at a prescribed position. Namely, this fixing ring 41 functions as a driving member for moving the positioning member 70 to the first position, at the time when holding the substrate Wf by the first holding member 31 and the second holding member 32. The fixing ring 41 can be formed by a rigid body. In one embodiment, the fixing ring 41 can be formed from a synthetic resin such as PVC or aromatic polyether ketone. The aromatic polyether ketone can include an aromatic polyether ketone such as PEK, PEEK, PEKK, PEEKK, or a compound material of these.

Figure 11A:
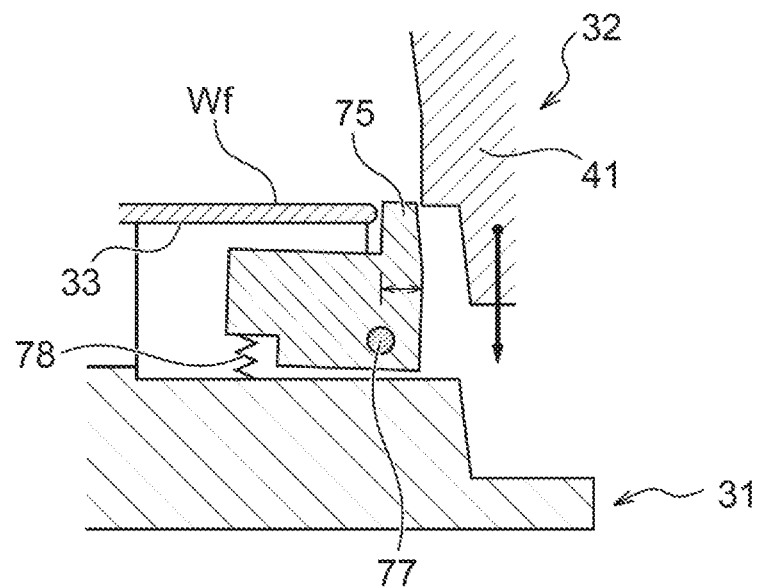
FIG. 11A is a schematic illustration showing a step for performing positioning of the substrate.
Figure 11B:
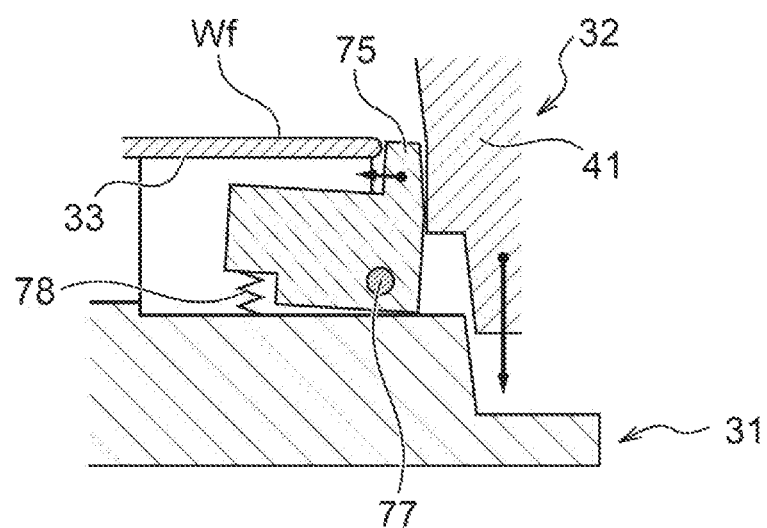
FIG. 11B is a schematic illustration showing a step for performing positioning of the substrate.
Figure 11C:
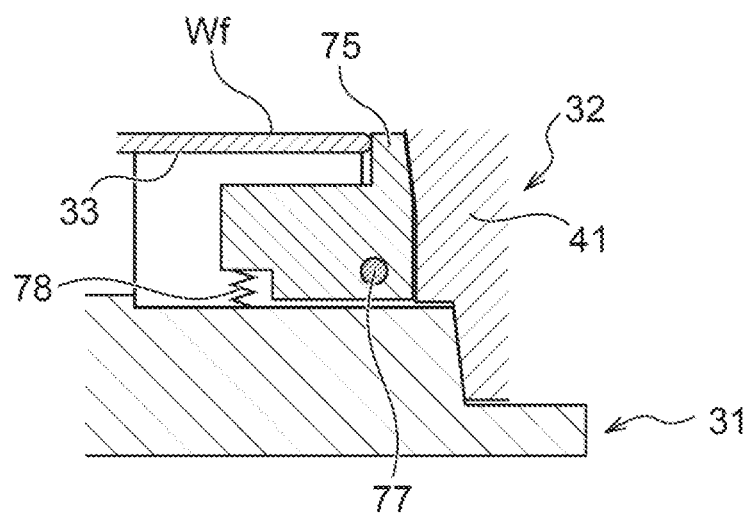
FIG. 11C is a schematic illustration showing a step for performing positioning of the substrate.

FIG. 11A to FIG. 11C are schematic illustrations showing steps for performing positioning of the substrate Wf. Note that, the structure of the substrate holder 30 is shown simplified in FIG. 11A to FIG. 11C. Moreover, the O-ring 78 is shown simplified by a spring that is a general member having elasticity. As shown in FIG. 11A, the second holding member 32 is attached to the first holding member 31, in a state where the substrate Wf is arranged on the support surface 33. At this time, as shown in FIG. 11B, the inner peripheral surface of the fixing ring 41 presses the tip part 75 to the center part side of the support surface 33, by contacting with the outer side of the tip part 75 of the positioning member 70. As a result of this, as shown in FIG. 11C, the substrate Wf can be positioned at a prescribed position of the support surface 33, for example, the center part, by having the inner side of the tip part 75 contact with the side part of the substrate Wf.

As described above, the positioning member 70 moves between the first position and the second position, by the substrate holder 30, and the fixing ring 41 can move the positioning member 70 to the first position, at the time when holding the substrate Wf by the first holding member 31 and the second holding member 32. As a result, the substrate Wf can be positioned, by causing the positioning member 70 to move to the first position by the fixing ring 41, without using a plate spring having an elastic force for the positioning member 70. Therefore, since it is not necessary to use a plate spring for the positioning member 70, the positioning member 70 can be formed by a rigid body such as a resin or metal. In the case where the substrate Wf is positioned by a conventional plate spring structure, it will be necessary to have a width to the degree of the plate spring structure, in order to secure an elastic force for sufficiently biasing the substrate Wf. However, according to the first embodiment, since it is not necessary to use a plate spring for the positioning member 70, the positioning member 70 can be formed by a rigid body, and as a result, the width of the positioning member 70 (the width of the substrate Wf peripheral direction) can be reduced compared to that used conventionally. Consequently, since the width of the positioning member 70 can be reduced, the width of the power feed connection points 50 can be increased, and the power feed connection points 50 can be arranged over approximately the entire periphery of the substrate Wf. As a result of this, an electrical current can flow uniformly to the substrate Wf, and the in-plane uniformity of a plating film formed on the substrate Wf can be improved.

Moreover, in the substrate holder 30 of the first embodiment, the positioning member 70 is biased to the second position by the O-ring 78, while not moving to the first position by the fixing ring 41. As a result, since the positioning member 70 is automatically positioned at the second position, at the time when not holding the substrate Wf by the first holding member 31 and the second holding member 32, the substrate Wf can be easily detached/attached from/to the substrate holder 30.

Moreover, in the first embodiment, since the positioning member 70 is freely rotatably supported by the pin 77, the moving space and setting space of the positioning member 70 can be reduced, for example, compared to the case where the positioning member 70 moves in a horizontal direction or vertical direction between the first position and the second position. As a result of this, enlargement of the size of the substrate holder 30 can be suppressed.

Moreover, in the first embodiment, the positioning member 70 has a first tip part 75a and a second tip part 75b, and the first tip part 75a and the second tip part 75b diverge. In other words, a space exists between the first tip part 75a and the second tip part 75b. At the time when positioning the substrate Wf, the fixing ring 41 moves the positioning member 70 to the first position by contacting with the second tip part 75b, and as a result, the first tip part 75a contacts with a peripheral edge part of the substrate Wf. At this time, by having a space exist between the first tip part 75a and the second tip part 75b, the first tip part 75a can contact with the substrate Wf by having some elasticity. In that case, even if there is a substrate Wf with a difference in size of several mm, the substrate Wf with a difference in size can be positioned by the positioning member 70, by having the first tip part 75a adsorb this dimension difference of several mm.

Figure 12:
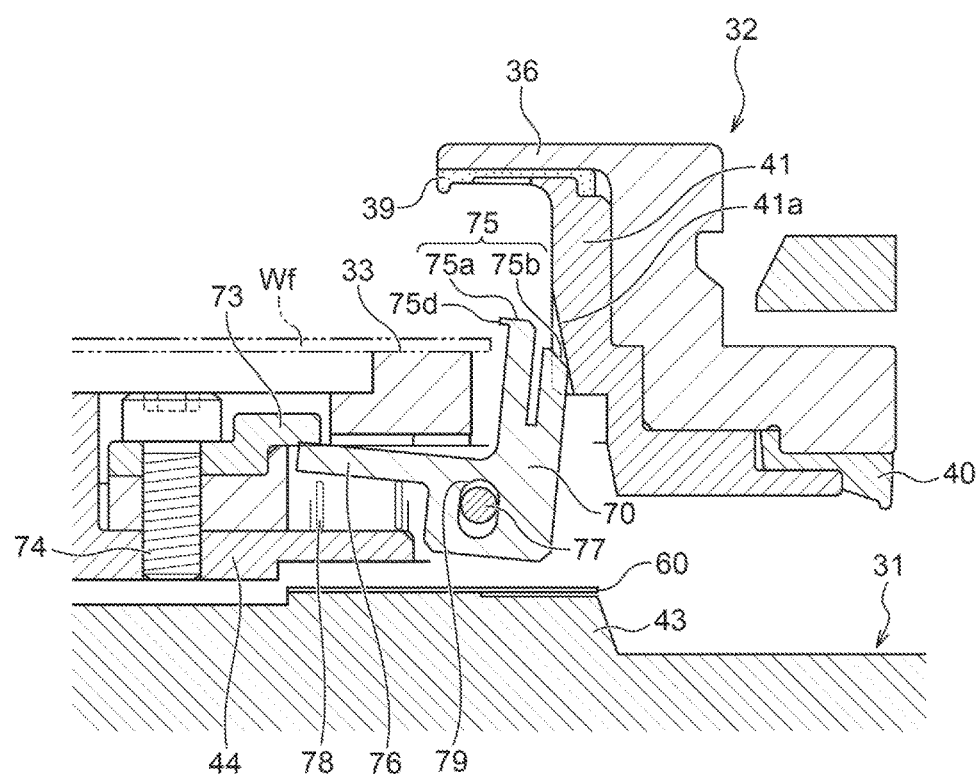
FIG. 12 is a partially expanded sectional view in a cross-section of a thickness direction of the substrate holder in a state where a substrate is held, which shows a modified example of the positioning member.

FIG. 12 is a partially expanded sectional view in a cross-section of a thickness direction of the substrate holder 30 in a state where the substrate is held, which shows a modified example of the positioning member 70. The positioning member 70 shown in FIG. 12 has a long hole 79 in which the pin 77 is inserted. The long hole 79 is formed so that the longer direction matches with the extending direction of the tip part 75. As a result, the positioning member 70 is freely rotatably supported by the pin 77, and can slide along the longer direction of the long hole 79. Moreover, this positioning member 70 has a hook part 75d, on the first tip part 75a, for pressing the substrate Wf to the support surface 33. The hook part 75d is provided so as to project from the end part of the first tip part 75a towards the inner side of the support surface 33 in radial direction.

The arm part 76 of the positioning member 70 is biased to the support surface 33 side by the O-ring 78. At this time, the pin 77 is positioned on the lower part of the long hole 79 (the first holding member 31 side). Namely, at the time when the positioning member 70 is at the second position not in contact with the substrate Wf, the pin 77 will be positioned on the lower part of the long hole 79, by the biasation force of the O-ring 78. Accordingly, at the time when the positioning member 70 is at the second position, the tip part 75 of the positioning member 70 shown in FIG. 12 will have a length that projects above the support surface 33 (the opposite side to the support base 43) longer than the tip part 75 of the positioning member 70 shown in FIG. 7 to FIG. 10. When attaching the second holding member 32 to the first holding member 31, by arranging the substrate Wf on the support surface 33, the tapered surface 41a of the fixing ring 41 will contact with the second tip part 75b of the positioning member 70. At this time, first, the tapered surface 41a presses the second tip part 75b to the inner side (center end side) of the support surface 33 in the radial direction. As a result, the first tip part 75a can move to the inner side (center part side) of the support surface 33 in the radial direction, and the substrate Wf can be positioned at a prescribed position. To continue, the tapered surface 41a presses the second tip part 75b towards the support base 43. At this time, the pin 77 slides in the long hole 79, and presses the substrate Wf to the support surface 33, by hanging the hook part 75d of the first tip part 75a on the edge of the substrate Wf. As a result, the substrate seal member 39 adhered to the substrate Wf can be detached from the substrate Wf, at the time when the substrate Wf is removed from the substrate holder 30.

According to the modified example of the positioning member 70 shown in FIG. 12, since the substrate Wf can be pressed to the support surface 33 by the hook part 75d, after performing positioning of the substrate Wf, the substrate seal member 39 adhered to the substrate Wf can be detached from the substrate Wf, at the time when removing the substrate Wf from the substrate holder. Moreover, since various pre-processes are performed on the substrate Wf held by the substrate holder 30, there will be cases where distortions occur in the substrate Wf. Since the distorted substrate Wf will have edge parts with different heights in the peripheral direction, there is the possibility that the first tip part 75a will not reach to the edge part, at the time when arranging the distorted substrate Wf on the support surface 33. The length of the first tip part 75a may be lengthened, in order to position the substrate Wf, by causing the first tip part 75a to surely contact with the edge part. However, since the length of the first tip part 75a will be restricted by the space enclosed by the first holding member 31 and the second holding member 32, it will not able to be infinitely lengthened. According to the modified example of the positioning member 70 shown in FIG. 12, the positioning member 70 is biased to the support surface 33 side by the O-ring 78 so that the pin 77 is positioned on the lower part of the long hole 79. Accordingly, the length of the portion projecting above the support surface 33 (the opposite side to the support base 43) can be lengthened, even if not lengthening the tip part 75 of the positioning member 70. Therefore, even if there is some distortion in the held substrate Wf, it will be easy for the first tip part 75a to contact with the edge of the distorted substrate Wf, and it will be easy for the substrate Wf to be positioned. In addition, even if there is such a distorted substrate Wf, the substrate seal member 39 adhered to the substrate Wf, which is pressed to the support surface 33 by the hook part 75d, can be detached from the substrate Wf, at the time when removing the substrate Wf from the substrate holder. Therefore, distortion of the substrate Wf can be at least partially eliminated, and a function can be present to detach the substrate seal member 39 adhered to the substrate Wf. Moreover, since the positioning member 70 is pressed towards the support base 43 along the long hole 79, the positioning member 70 can be easily stored in a space enclosed by the first holding member 31 and the second holding member 32.

Second Embodiment

Next, a substrate holder according to a second embodiment of the present invention will be described. The substrate holder according to the second embodiment can be used by the plating apparatus described in the first embodiment. Hereinafter, the portions different from the portions of the substrate holder 30 in the first embodiment will be mainly described for the substrate holder according to the second embodiment.

Figure 13:
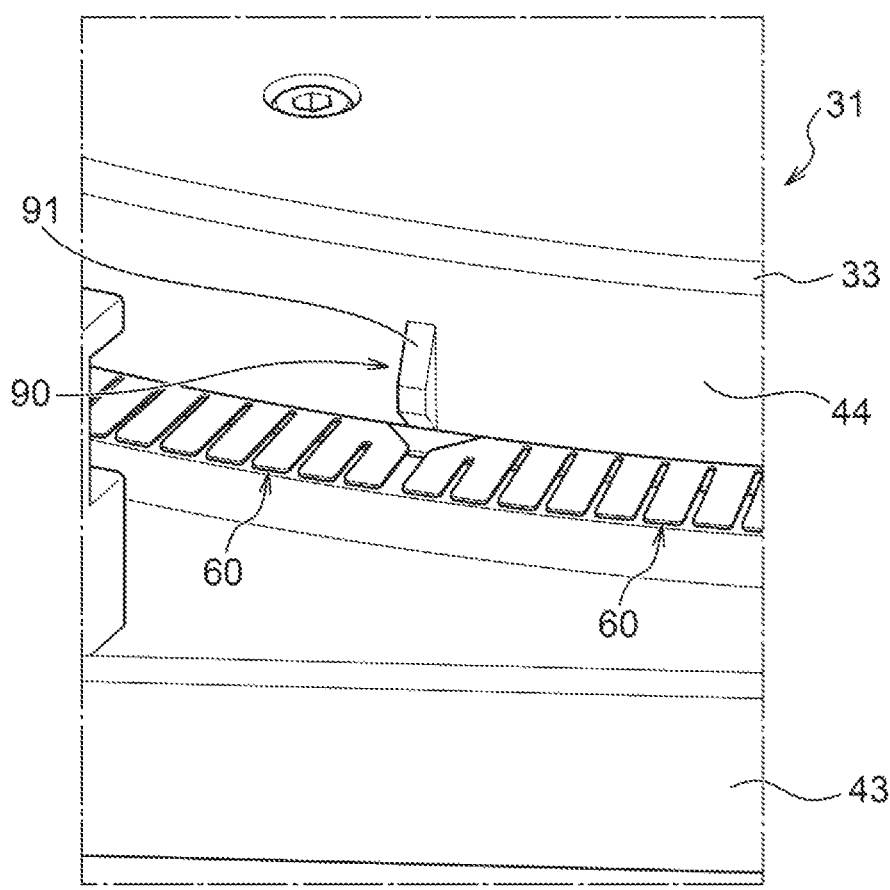
FIG. 13 is a partial perspective view of the first holding member of the substrate holder according to a second embodiment.

FIG. 13 is a partial perspective view of the first holding member 31 of the substrate holder according to the second embodiment. The first holding member 31 of the substrate holder 30 according to the second embodiment has projection parts 90 on the side surface of the movable base 44. While one projection part 90 is shown in FIG. 13, a plurality of the projection parts 90 are provided at equal intervals along the peripheral direction on the side surface of the movable base 44. The projection parts 90 have a tapered surface 91 on the support surface 33 side. The tapered surface 91 is formed so that the projection amount of the projection part 90 increases from the support surface 33 side towards the support base 43 side. The projection parts 90 function as a driving member that causes the positioning member 70 to move to the first position where the substrate Wf is to be positioned by having the positioning member 70 contact with the substrate Wf, at the time when holding the substrate Wf by the first holding member 31 and the second holding member 32. The projection parts 90 can be formed by rigid bodies. In one embodiment, the projection parts 90 can be formed from a synthetic resin such as PVC or aromatic polyether ketone. The aromatic polyether ketone can include an aromatic polyether ketone such as PEK, PEEK PEKK, PEEKK, or a compound material of these.

Figure 14:
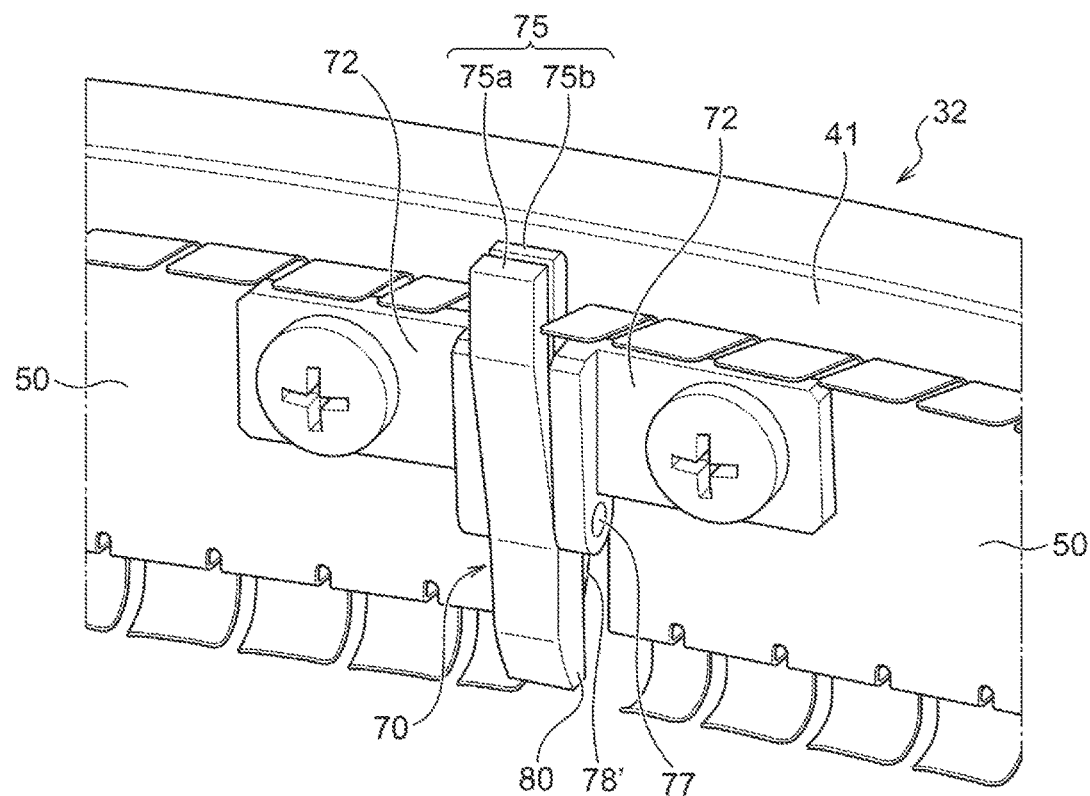
FIG. 14 is a perspective view of the positioning member of the substrate holder according to a second embodiment.

FIG. 14 is a perspective view of the positioning member 70 of the substrate holder 30 according to the second embodiment. The second holding member 32 of the substrate holder 30 according to the second embodiment has the positioning members 70. The support members 72 are fixed by fixing devices such as screws to the fixing ring 41 of the first holding member 31. The positioning member 70 is connected to the support members 72 via the pin 77. The positioning member 70 is freely rotatably supported by the pin 77. The positioning member 70 is, as a whole, an approximately plate shaped member, the tip part 75, which includes the first tip part 75a and the second tip part 75b, is formed on one end of the positioning member 70, and a contact part 80, constituted so as to contact with the projection part 90 shown in FIG. 13, is formed on the other end. A spring 78', as an example of an elastic body, is provided between the contact part 80 and the fixing ring 41. The spring 78' biases the contact part 80 to a direction separated from the inner peripheral surface of the fixing ring 41. As a result, the tip part 75 is biased to a direction approaching the inner peripheral surface of the fixing ring 41.

Figure 15:
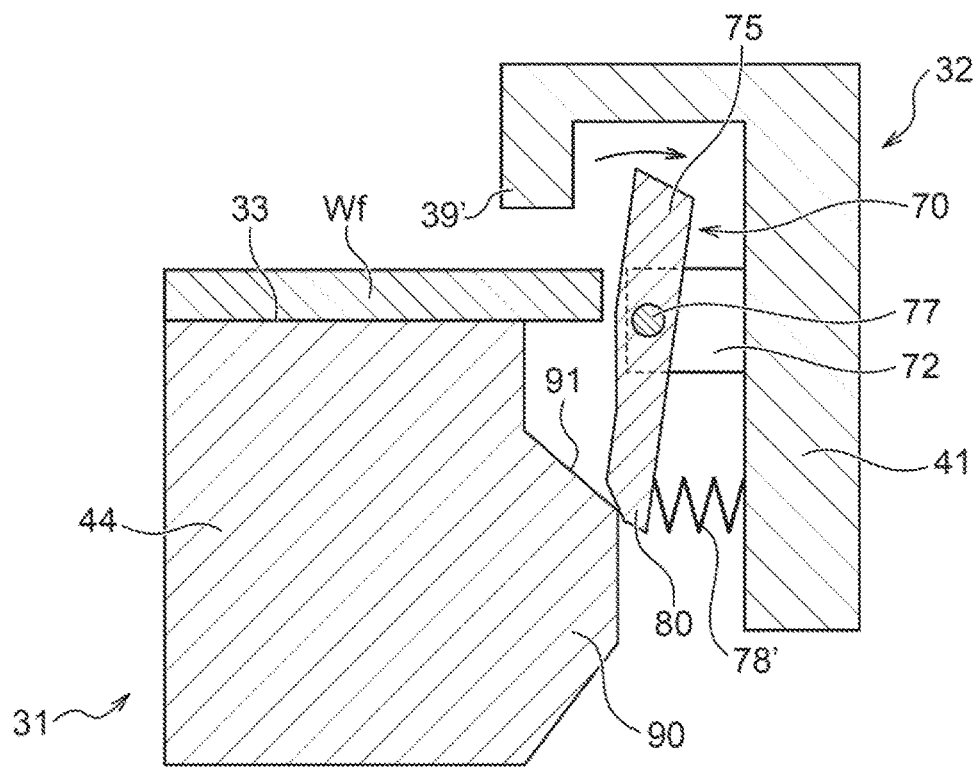
FIG. 15 is a schematic sectional view showing the substrate holder according to a second embodiment prior to attaching the second holding member to the first holding member.
Figure 16:
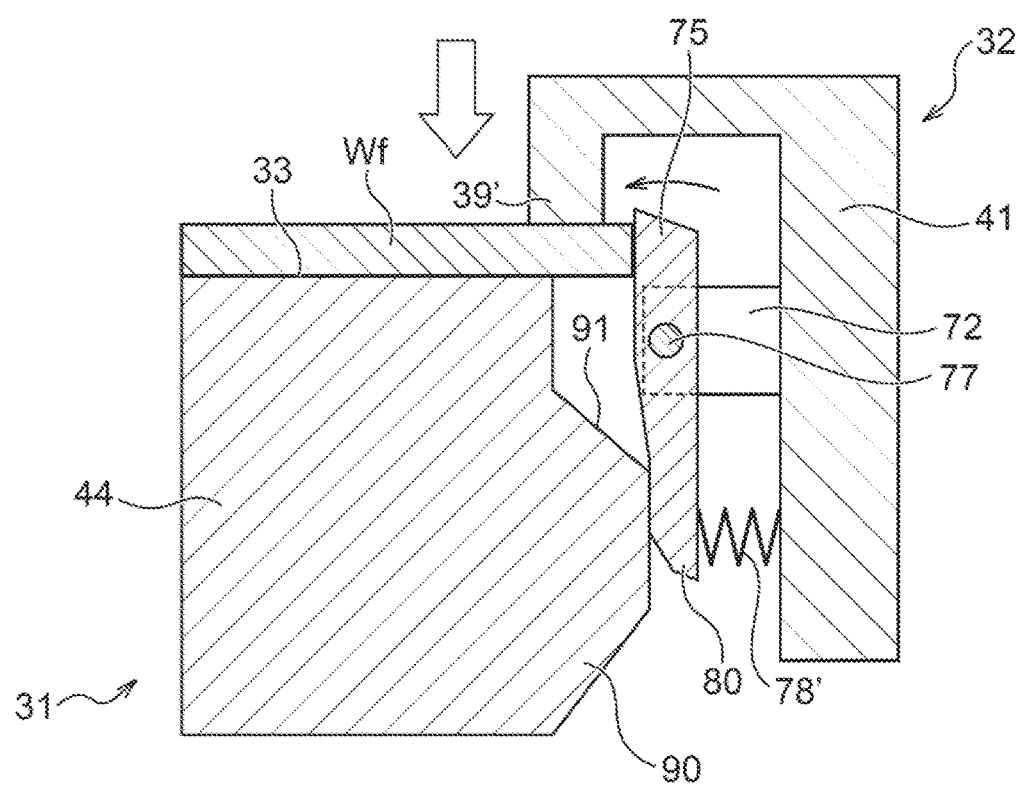
FIG. 16 is a schematic sectional view showing the substrate holder according to a second embodiment at the time when attaching the second holding member to the first holding member.

FIG. 15 is a schematic sectional view showing the substrate holder 30 according to the second embodiment prior to attaching the second holding member 32 to the first holding member 31. FIG. 16 is a schematic sectional view showing the substrate holder 30 according to the second embodiment at the time when attaching the second holding member 32 to the first holding member 31. Note that, the structure of the substrate holder 30 is shown simplified in FIG. 15 and FIG. 16. As shown in FIG. 15, the positioning member 70 is at the second position not in contact with the substrate Wf, prior to attaching the second holding member 32 to the first holding member 31. Specifically, as shown in FIG. 15, the contact part 80 is biased towards the inner side of the support surface 33 in the radial direction, by the spring 78'. On the other hand, the tip part 75 of the positioning member 70 is biased towards the outer side of the support surface 33 in the radial direction.

As shown in FIG. 16, the contact part 80 of the positioning member 70 is pressed towards the outer side of the support surface 33 in the radial direction by the projection parts 90, at the time when attaching the second holding member 32 to the first holding member 31, and as a result of this, the positioning member 70 rotates, and the tip part 75 of the positioning member 70 moves towards the inner side of the support surface 33 in the radial direction. As a result, the tip part 75 of the positioning member 70 can position the substrate Wf at a prescribed position, for example, the center part, of the support surface 33, by contacting with the side part of the substrate Wf. Moreover, between the substrate Wf surface and the seal holder 36 is sealed by having a substrate seal member 39' of the fixing ring 41 contact with the outer peripheral part of the substrate Wf, at the same time or after positioning the substrate Wf at the prescribed position of the support surface 33.

The substrate holder 30 according to the second embodiment has an advantage similar to that of the substrate holder 30 according to the first embodiment. In addition to this, by having the positioning members 70 provided in the second holding member 32, the substrate holder 30 according to the second embodiment will have the following advantage. In the substrate holder 30 according to the second embodiment, since the positioning members 70 are provided in the second holding member 32, which has the power feed connection points 50, the positional relationship between the positioning members 70 and the power feed connection points 50 will be fixed via the second holding member 32. Therefore, by having the positioning members 70 position the substrate Wf, the position of the substrate Wf with respect to the power feed connection points 50 will be directly determined. Namely, since the positional relationship between the power feed connection points 50 and the substrate Wf can be determined by the positioning members 70, the distance from the center of the substrate Wf up to the power feed connection points 50 can be made constant. As a result, the current flowing from the plurality of power feed connection points 50 to the substrate Wf will be uniform, and the in-plane uniformity of a plating film formed on the substrate Wf can be improved.

Third Embodiment

Next, a substrate holder according to a third embodiment of the present invention will be described. The substrate holder according to the third embodiment is a so-called jet-type or cup-type substrate holder. Namely, the substrate holder according to the third embodiment holds a surface to be plated of the substrate downwards (face-down) and approximately horizontal. At the time when performing plating on a substrate held by this substrate holder, the substrate is soaked in a plating liquid in an approximately horizontal state, or a plating liquid spouts up from below. The substrate holder according to the third embodiment can be used by a known plating apparatus that performs plating by a jet-type or cup-type substrate holder.

The holding mechanism of the substrate holder according to the third embodiment is approximately the same as the holding mechanism of the substrate holder according to the second embodiment. On the other hand, the substrate holder according to the third embodiment has a holding procedure of a substrate that is different, compared to that of the second embodiment. Hereinafter, the portions different from the portions of the substrate holder 30 in the second embodiment will be mainly described for the substrate holder according to the third embodiment.

Figure 17:
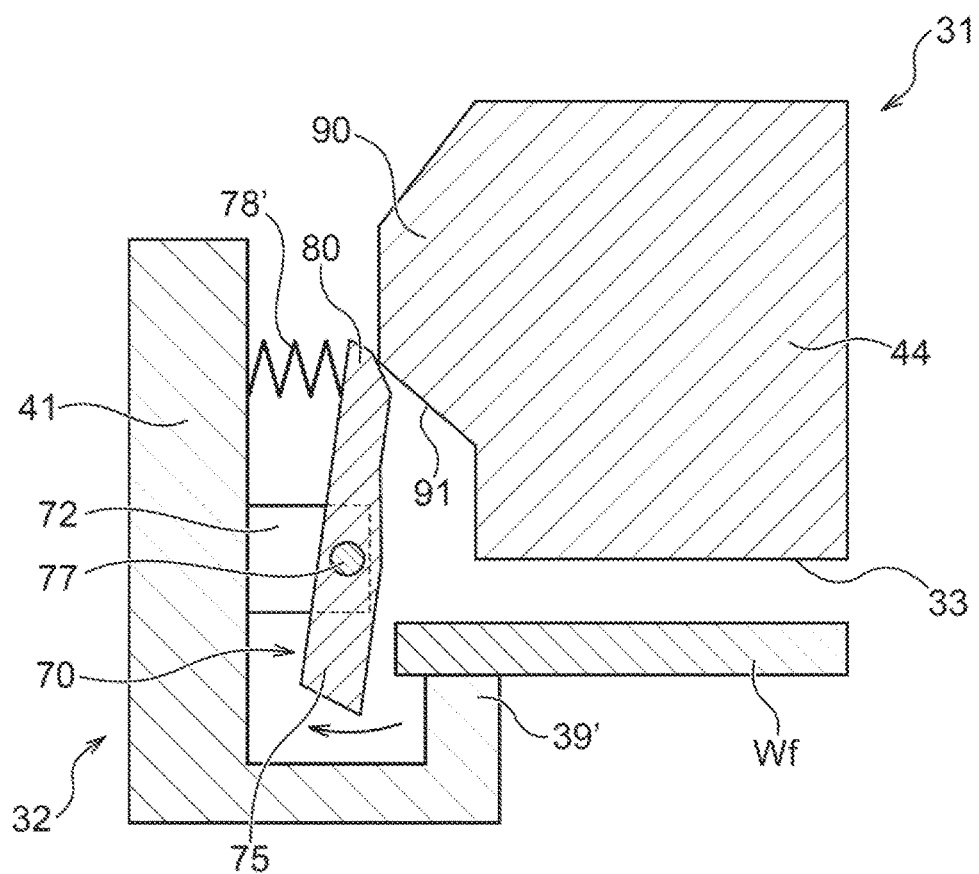
FIG. 17 is a schematic sectional view showing the substrate holder according to a third embodiment prior to attaching the first holding member to the second holding member.
Figure 18:
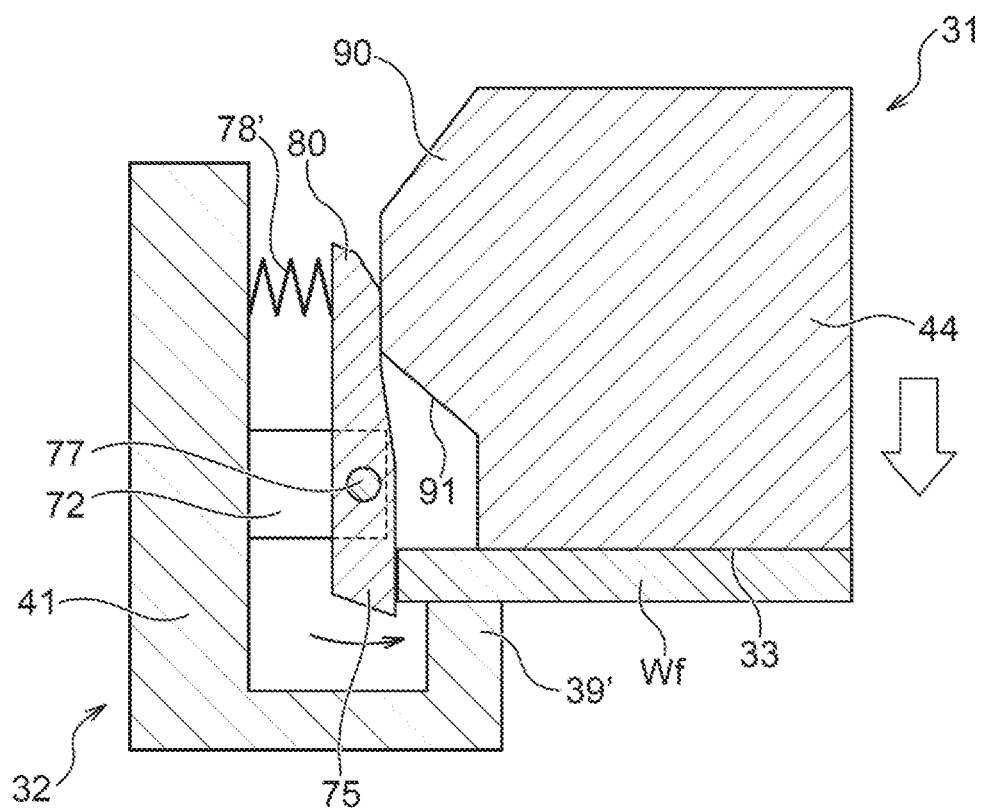
FIG. 18 is a schematic sectional view showing the substrate holder according to a third embodiment at the time when attaching the first holding member to the second holding member.

FIG. 17 is a schematic sectional view showing the substrate holder 30 according to the third embodiment prior to attaching the first holding member 31 to the second holding member 32. FIG. 18 is a schematic sectional view showing the substrate holder 30 according to the third embodiment at the time when attaching the first holding member 31 to the second holding member 32. Note that, the structure of the substrate holder 30 is shown simplified in FIG. 17 and FIG. 18. As shown in FIG. 17, in the substrate holder 30 according to the third embodiment, first, the substrate Wf is arranged on the substrate seal member 39' of the second holding member 32. At this time, the surface to be plated of the substrate Wf is turned downwards in the figure.

As shown in FIG. 17, the positioning member 70 is at the second position not in contact with the substrate Wf, prior to attaching the first holding member 31 to the second holding member 32. Specifically, as shown in FIG. 17, the contact part 80 is biased towards the inner side of the support surface 33 in the radial direction, by the spring 78'. On the other hand, the tip part 75 of the positioning member 70 is biased towards the outer side of the support surface 33 in the radial direction.

To continue, as shown in FIG. 18, the contact part 80 of the positioning member 70 is pressed towards the outer side of the support surface 33 in the radial direction by the projection parts 90, at the time when attaching the second holding member 32 to the first holding member 31, and as a result of this, the positioning member 70 rotates, and the tip part 75 of the positioning member 70 moves towards the inner side of the support surface 33 in the radial direction. As a result, the tip part 75 of the positioning member 70 can position the substrate Wf at a prescribed position, for example, the center part, of the support surface 33, by contacting with the side part of the substrate Wf. In other words, the substrate Wf is positioned at a prescribed position, for example, the center part, of the annular substrate seal member 39'. Moreover, the support surface 33 of the first holding member 31 presses the substrate Wf to the substrate seal member 39', at the same time or after positioning the substrate Wf at the prescribed position of the support surface 33. As a result, the substrate seal member 39' of the fixing ring 41 is pressed to the outer peripheral part of the substrate Wf, and between the substrate Wf surface and the seal holder 36 is sealed.

The substrate holder 30 according to the third embodiment has an advantage similar to that of the substrate holder 30 according to the second embodiment. Namely, in the substrate holder 30 according to the third embodiment, since the positioning members 70 are provided in the second holding member 32, which has the power feed connection points 50, the positional relationship between the positioning members 70 and the power feed connection points 50 will be fixed via the second holding member 32. Therefore, by having the positioning members 70 position the substrate Wf, the position of the substrate Wf with respect to the power feed connection points 50 will be directly determined. Namely, since the positional relationship between the power feed connection points 50 and the substrate Wf can be determined by the positioning members 70, the distance from the center of the substrate Wf up to the power feed connection points 50 can be made constant. As a result, the current flowing from the plurality of power feed connection points 50 to the substrate Wf will be uniform, and the in-plane uniformity of a plating film formed on the substrate Wf can be improved.

Heretofore, while embodiments of the present invention have been described, the above described embodiments of the present invention are for easily understanding the present invention, and do not limit the present invention. It is needless to say that the present invention can be modified or improved, without departing from the scope of the present invention, and the equivalent of this is included in the present invention. For example, it is needless to say that the above described embodiments of the invention can be applied to a cup-type electrolytic plating apparatus. Moreover, the above described embodiments of the invention can also be applied to a non-electrolytic plating apparatus so as to perform a plating process by soaking a substrate in a non-electrolytic plating liquid. For example, the concepts of "substrate holder" and "wafer holder" generally extend up to various combinations or partial combinations of components, which enable movement and positioning of a substrate, by engaging with the substrate. As an example, a substrate holding member can be included in this concept, for example, which has a cup having a compressible lip seal and a cone set so as to engage with a substrate, and is configured so that this lip seal forms a liquid-tight seal, by compressing the lip seal by a force in the vertical direction from the cone and the substrate. Moreover, a substrate holding member configured to hold a plurality of substrates by back-to-back substrate holders can also be included in the concept of the embodiments of the present invention. Moreover, each of the constituent elements described in the claims and specification can be arbitrarily combined or omitted, in a range that can solve at least a part of the above described problem, or in a range that accomplishes at least a part of the effect.

REFERENCE SIGNS LIST

30 . . . substrate holder
31 . . . first holding member
32 . . . second holding member
33 . . . support surface
41 . . . fixing ring
50 . . . power feed connection point
70 . . . positioning member
75 . . . tip part
75a . . . first tip part
75b . . . second tip part
75c . . . tapered surface
75d . . . hook part
77 . . . pin
78 . . . O-ring
78' . . . spring
80 . . . contact part
85 . . . guide member
86 . . . plate-shaped part
87 . . . tapered surface
90 . . . projection part
91 . . . tapered surface

What is claimed is:

1. A substrate holder, comprising:
a first holding member having a first surface that contacts with a substrate; and
a second holding member being attachable to the first holding member to sandwich the substrate between the first holding member and the second holding member,
wherein a positioning member is provided on the first holding member and configured to position the substrate which is in contact with the first surface, the positioning member comprising an extension that contacts a peripheral edge part of the substrate when the substrate is at a prescribed position of the first surface,
wherein the positioning member is configured to move between a first position where the substrate is to be positioned at the prescribed position of the first surface and the positioning member is in contact with the peripheral edge part of the substrate, and a second position not in contact with the substrate, the positioning member positioning the substrate by contacting with the second holding member and the peripheral edge part of the substrate to move toward an inside of the substrate in a radial direction,
wherein a driving member is provided on the second holding member and comprises a surface configured to cause the positioning member to be positioned at the first position, at the time when holding the substrate by the first holding member and the second holding member,
wherein the positioning member has a tip part,
wherein the tip part diverges into a first tip part and a second tip part,
wherein the first tip part is positioned at an inner side in a radial direction of the substrate, in a state where the substrate is held by the first holding member and the second holding member,
wherein the second tip part is positioned at an outer side in a radial direction of the substrate in a state where the substrate is held by the first holding member and the second holding member,
wherein the first tip part is configured to contact with the substrate, and
wherein the second tip part is configured to contact with the driving member.

2. A substrate holder, comprising:
a first holding member having a first surface that contacts with a substrate; and
a second holding member being attachable to the first holding member and configured to sandwich the substrate together with the first holding member,
wherein a positioning member is provided on the second holding member and configured to positioning the substrate which is in contact with the first surface, the positioning member contacting a peripheral edge part of the substrate when the substrate is at a prescribed position of the first surface,
wherein the positioning member is configured to move between a first position where the substrate is to be positioned at the prescribed position of the first surface and an extension of the positioning member is in contact with the peripheral edge part of the substrate and contacting with the first holding member, and a second position not in contact with the substrate, the positioning member positioning the substrate by moving toward an inside of the substrate in a radial direction,
wherein a driving member is provided on the first holding member and is configured to cause the positioning member to be positioned at the first position, at the time when holding the substrate by the first holding member and the second holding member,
wherein the positioning member has a tip part,
wherein the tip part diverges into a first tip part and a second tip part,
wherein the first tip part is positioned at an inner side in a radial direction of the substrate, in a state where the substrate is held by the first holding member and the second holding member,
wherein the second tip part is positioned at an outer side in a radial direction of the substrate in a state where the substrate is held by the first holding member and the second holding member,
wherein the first tip part is configured to contact with the substrate, and
wherein the second tip part is configured to contact with the driving member.

3. The substrate holder according to claim 1,
wherein the positioning member and/or the driving member are formed by rigid bodies.

4. The substrate holder according to claim 1,
wherein the positioning member and/or the driving member are formed from aromatic polyether ketone.

5. The substrate holder according to claim 1,
wherein the driving member is formed from a synthetic resin.

6. The substrate holder according to claim 1, further comprising:
a biasing member, the biasing member arranged between the first holding member or the second holding member and the positioning member, and configured to bias the positioning member to the second position.

7. The substrate holder according to claim 1, further comprising:
a pin for freely rotatably supporting the positioning member, wherein the positioning member moves between the first position and the second position, by rotating centered on the pin.

8. The substrate holder according to claim 1, wherein a guide member is provided on the first holding member and configured to guide the substrate to the prescribed position on the first surface.

9. The substrate holder according to claim 1, wherein a substrate seal member and a holder seal member are provided in the first holding member or the second holding member, the substrate seal member configured to seal between the second holding member and the substrate, and the holder seal member configured to seal between the second holding member and the first holding member.

10. The substrate holder according to claim 1, further comprising:
a power feed portion contacting with the substrate across a length equal to or more than 95% of an outer circumference of the substrate and configured to feed electricity to the substrate.

11. A plating apparatus for performing a plating process on a substrate by using the substrate holder according to claim 1.

12. A substrate holder, comprising:
a first member having a raised surface configured to contact a substrate;
a brace attachable to the first surface, wherein the brace and the first member are configured to couple together to sandwich the substrate; and
at least two extension parts coupled to the first member, wherein the at least two extension parts are perpendicular to the raised surface and laterally movable relative to the raised surface,
wherein the at least two extension parts move between a first position where the substrate is to be positioned at a prescribed position of the raised surface and the at least two extension parts are in contact with a peripheral edge part of the substrate and a second position where the at least two extension parts are not in contact with the substrate, wherein the at least two extension parts position the substrate at the prescribed position by contacting with an inside portion of the annular brace and the peripheral edge part of the substrate to move laterally toward an inside of the substrate,
wherein the inside portion of the brace causes the at least two extension parts to be positioned at the first position when the brace and the first member are coupled together
wherein the at least two extension parts include a first tip part and a second tip part,
wherein the first tip part is positioned at an inner side in a radial direction of the substrate, in a state where the substrate is held by the first member and the brace,
wherein the second tip part is positioned at an outer side in a radial direction of the substrate, in a state where the substrate is held by the first member and the brace,
wherein the first tip part is configured to contact with the substrate, and
wherein the second tip part is configured to contact with the inside portion of the brace.

13. The substrate holder according to claim 12, wherein the at least two extension parts and/or the inside portion of the brace are rigid bodies.

14. The substrate holder according to claim 12, wherein the at least two extension parts and/or the inside portion of the brace are formed from aromatic polyether ketone.

15. The substrate holder according to claim 12, wherein the inside portion of the brace is formed from a synthetic resin.

16. The substrate holder according to claim 12, wherein raised surface configured to contact the substrate comprises an annular shape.

\* \* \* \* \*